(12) United States Patent
Akiyoshi et al.

(10) Patent No.: US 12,283,565 B2
(45) Date of Patent: Apr. 22, 2025

(54) ADHESIVE FOR SEMICONDUCTOR, PRODUCTION METHOD THEREFOR, AND SEMICONDUCTOR DEVICE AND PRODUCTION METHOD THEREFOR

(71) Applicant: Showa Denko Materials Co., Ltd., Tokyo (JP)

(72) Inventors: Toshiyasu Akiyoshi, Tokyo (JP); Masanobu Miyahara, Tokyo (JP); Ryuta Kawamata, Tokyo (JP)

( * ) Notice: Subject to any disclaimer, the term of this patent is extended or adjusted under 35 U.S.C. 154(b) by 439 days.

(21) Appl. No.: 17/764,202

(22) PCT Filed: Sep. 16, 2020

(86) PCT No.: PCT/JP2020/035123
§ 371 (c)(1),
(2) Date: Mar. 28, 2022

(87) PCT Pub. No.: WO2021/065518
PCT Pub. Date: Apr. 8, 2021

(65) Prior Publication Data
US 2022/0352116 A1 Nov. 3, 2022

(30) Foreign Application Priority Data
Sep. 30, 2019 (WO) .................. PCT/JP2019/038631

(51) Int. Cl.
*H01L 23/00* (2006.01)
*C08G 59/50* (2006.01)
(Continued)

(52) U.S. Cl.
CPC .............. *H01L 24/81* (2013.01); *H01L 24/29* (2013.01); *H01L 25/0652* (2013.01);
(Continued)

(58) Field of Classification Search
CPC ..... H01L 24/81; H01L 24/29; H01L 25/0652; H01L 2224/73204; H01L 2224/81193;
(Continued)

(56) References Cited

U.S. PATENT DOCUMENTS

2004/0070083 A1\* 4/2004 Su .................. H01L 25/0657
257/E25.023
2010/0140801 A1\* 6/2010 Anbai ............... H01L 23/49816
257/738
(Continued)

FOREIGN PATENT DOCUMENTS

CN 101426875 5/2009
CN 102177214 9/2011
(Continued)

OTHER PUBLICATIONS

Osamu Kato, "Development of Chip Stacking Technology Using Through Silicon via", OKI Technical Review, 2007, 211, 74(3).
(Continued)

*Primary Examiner* — Antonio B Crite
(74) *Attorney, Agent, or Firm* — SOEI PATENT & LAW FIRM

(57) ABSTRACT

An adhesive for semiconductors, the adhesive containing a thermoplastic resin, a thermosetting resin, a curing agent having a reactive group, and a flux compound having an acid group. The adhesive has a calorific value of 20 J/g or less at 60° C. to 155° C. on a DSC curve, which is obtained by differential scanning calorimetry involving heating the adhesive at a rate of temperature increase of 10° C./min.

17 Claims, 7 Drawing Sheets

(51) Int. Cl.
  *C09J 7/22*    (2018.01)
  *C09J 7/35*    (2018.01)
  *C09J 11/06*   (2006.01)
  *C09J 11/08*   (2006.01)
  *C09J 163/00*  (2006.01)
  *C09J 201/00*  (2006.01)
  *H01L 21/56*   (2006.01)
  *H01L 25/00*   (2006.01)
  *H01L 25/065*  (2023.01)

(52) U.S. Cl.
  CPC ............. *H01L 2224/73204* (2013.01); *H01L 2224/81193* (2013.01); *H01L 2224/81815* (2013.01); *H01L 2224/81885* (2013.01)

(58) Field of Classification Search
  CPC .. H01L 2224/81815; H01L 2224/81885; C09J 163/00; C09J 201/00; C09J 7/35
  See application file for complete search history.

(56) References Cited

U.S. PATENT DOCUMENTS

| | | | |
|---|---|---|---|
| 2017/0018472 | A1 | 1/2017 | Takamoto et al. |
| 2017/0301597 | A1* | 10/2017 | Hoshiyama ........... C08G 59/621 |

FOREIGN PATENT DOCUMENTS

| | | |
|---|---|---|
| CN | 103249559 | 8/2013 |
| CN | 104137240 | 11/2014 |
| CN | 104220533 | 12/2014 |
| CN | 105073939 | 11/2015 |
| JP | 2000-100862 | 4/2000 |
| JP | 2001-152107 | 6/2001 |
| JP | 2001-332520 | 11/2001 |
| JP | 2003-142529 | 5/2003 |
| JP | 2005-028734 | 2/2005 |
| JP | 2007-211244 | 8/2007 |
| JP | 2008-001760 | 1/2008 |
| JP | 2008-294382 | 12/2008 |
| JP | 2010-132840 | 6/2010 |
| JP | 2010-184963 | 8/2010 |
| JP | 2016-139757 | 8/2016 |
| JP | 2017-098309 | 6/2017 |
| JP | 6280400 | 2/2018 |
| JP | 2018-145346 | 9/2018 |
| JP | 2019-019248 | 2/2019 |
| KR | 10-2016-0130757 | 11/2016 |
| KR | 10-2020-0020666 | 2/2020 |
| TW | 201546222 | 12/2015 |
| TW | 201718687 | 6/2017 |
| TW | 201739873 | 11/2017 |
| TW | 201906956 | 2/2019 |
| WO | 2013/094924 | 6/2013 |
| WO | 2013/125086 | 8/2013 |
| WO | 2018/225323 | 12/2018 |
| WO | 2018/235854 | 12/2018 |

OTHER PUBLICATIONS

International Search Report dated Nov. 24, 2020 for PCT/JP2020/035122.
International Search Report dated Nov. 24, 2020 for PCT/JP2020/035123.
International Preliminary Report on Patentability with Written Opinion dated Apr. 14, 2022 for PCT/JP2020/035122.
International Preliminary Report on Patentability with Written Opinion dated Apr. 14, 2022 for PCT/JP2020/035123.
Edited and Translated by Cui Baojun, "Adhesive novel patents", Adhesion, Dec. 31, 2014, p. 92-p. 93 (with English partial translation).
Naoya Saiki et al., "Ultraviolet/Heat Dual-Curable Film Adhesives with Pendant-Acryloyl-Functional-Group-Modified Epoxy Resin", Journal of Applied Polymer Science, vol. 117, Sep. 15, 2010, p. 3466-p. 3472.

* cited by examiner (b)

(c)

(d)

(e)

ADHESIVE FOR SEMICONDUCTOR, PRODUCTION METHOD THEREFOR, AND SEMICONDUCTOR DEVICE AND PRODUCTION METHOD THEREFOR

CROSS-REFERENCE TO RELATED APPLICATIONS

This application is a 35 U.S.C. § 371 national phase application of PCT/JP2020/035123, filed on Sep. 16, 2020, which claims priority to International Patent Application of PCT/JP2019/038631, filed on Sep. 30, 2019.

TECHNICAL FIELD

The present invention relates to an adhesive for semiconductors, a method for producing an adhesive for semiconductors, a semiconductor device, and a method for producing a semiconductor device.

BACKGROUND ART

Upon connecting a semiconductor chip and a substrate, a wire bonding method of using a metal wire such as a gold wire has been hitherto widely applied.

In recent years, in order to cope with the demands for functional improvement, higher integration, speed increase, and the like for semiconductor devices, a flip-chip connection system (FC connection system) of forming conductive protrusions called bumps on a semiconductor chip or a substrate to directly connect a semiconductor chip and a substrate is becoming popular.

For example, with regard to the connection between a semiconductor chip and a substrate, a connection system of COB (Chip On Board) type, which is actively used for BGA (Ball Grid Array), CSP (Chip Size Package), and the like, also corresponds to the FC connection system. The FC connection system is also widely used in a connection system of COC (Chip On Chip) type, in which a connection part (bumps or wiring) is formed on a semiconductor chip to connect between semiconductor chips, and a connection system of COW (Chip On Wafer) type, in which a connection part (bumps or wiring) is formed on a semiconductor wafer to connect between a semiconductor chip and a semiconductor wafer (see, for example, Patent Literature 1).

In semiconductor packages where further size reduction, thickness reduction, and functional improvement are strongly demanded, a chip-stack type package obtained by laminating and multi-staging the above-mentioned connection systems, POP (Package On Package), TSV (Through-Silicon Via), and the like are also starting to be widely popularized. In such lamination and multi-staging technologies, since semiconductor chips and the like are three-dimensionally disposed, semiconductor packages can be made small compared to the techniques of two-dimensionally disposing semiconductor chips and the like. From the viewpoint that the lamination and multi-staging technologies are effective even for enhancing the performance of semiconductors, lowering noise, reducing the footprint, saving electric power, and the like, attention has been paid to the lamination and multi-staging technologies as the next-generation semiconductor wiring technologies.

However, generally, metal bonding is used for the connection between connection parts, from the viewpoint of sufficiently securing connection reliability (for example, insulation reliability). Examples of main metals used for the above-described connection parts (for example, bumps and wiring) include solder, tin, gold, silver, copper, and nickel, and conductive materials including a plurality of kinds of these are also used. With regard to the metals used for a connection part, since the surface is oxidized and an oxide film is produced, and since impurities such as oxides adhere to the surface, impurities may be generated on the connection surfaces of the connection part. When such impurities remain, there is concern that the connection reliability (for example, insulation reliability) between a semiconductor chip and a substrate or between two semiconductor chips may be decreased, and the merit of employing the above-mentioned connection systems may be impaired.

As a method for suppressing the generation of these impurities, there is a method of coating a connection part with an antioxidant film, the method being known as an OSP (Organic Solderability Preservatives) treatment; however, this antioxidant film may cause lowering of solder wettability, lowering of connectivity, and the like during connection processes.

Thus, as a method for removing the above-mentioned oxide film and impurities, a method of incorporating a fluxing agent into an adhesive for semiconductors has been proposed (see, for example, Patent Literature 2).

CITATION LIST

Patent Literature

Patent Literature 1: Japanese Unexamined Patent Publication No. 2008-294382
Patent Literature 2: International Publication WO 2013/125086

SUMMARY OF INVENTION

Technical Problem

In recent years, from the viewpoint of enhancing productivity, there has been proposed a process of mounting and temporarily fixing a plurality of semiconductor chips on a mount-receiving member (a semiconductor chip, a semiconductor wafer, a wiring circuit board, or the like) by means of an adhesive for semiconductors and performing curing and sealing all together. In this process, a semiconductor chip is temporarily fixed to a mount-receiving member by applying heat (about 60° C. to 155° C.) to a stage to the extent that the adhesive for semiconductors becomes flowable, and then the adhesive for semiconductors is cured all together by reflow at a temperature higher than or equal to the melting point of the connection part (for example, about 260° C.). According to this process, a plurality of semiconductor packages can be efficiently produced.

In the above-described process, voids may remain in the adhesive for semiconductors, and in order to prevent the generation of these voids, a method of performing batch curing under pressurized conditions has been proposed. However, when the number of semiconductor chips becomes larger, voids may remain even when the above-described method is used, and it has become clear that there is still room for further improvement.

Thus, according to an aspect of the present invention, in a process of temporarily fixing a plurality of semiconductor chips on a mount-receiving member by means of an adhesive for semiconductors and performing curing and sealing all together, voids that can remain in the adhesive for semiconductors are reduced.

Solution to Problem

The present inventors inferred that when the number of semiconductor chips is large in the above-described process, since the adhesive for semiconductors is partially cured at the time of temporary fixing, consequently voids are likely to remain in the adhesive for semiconductors. That is, since semiconductor chips are sequentially mounted in the above-described process, the semiconductor chip and the adhesive for semiconductors mounted in the beginning are continuously subjected to a thermal history caused by the stage until mounting of the last semiconductor chip is completed. Therefore, it is inferred that when the number of semiconductor chips becomes large, curing of the adhesive for semiconductors for temporarily fixing the semiconductor chip mounted in the beginning proceeds partially, and voids remain without being removed as a result of pressurization during batch curing. The present inventors conducted further investigations based on the above-described inference and completed the present invention.

Several aspects of the present invention provide the following.

[1] An adhesive for semiconductors, the adhesive comprising a thermoplastic resin, a thermosetting resin, a curing agent having a reactive group, and a flux compound having an acid group, wherein the calorific value at 60° C. to 155° C. on a DSC curve is 20 J/g or less when the DSC curve is obtained by differential scanning calorimetry of heating the adhesive for semiconductors at a rate of temperature increase of 10° C./min.

[2] The adhesive for semiconductors according to [1], wherein the weight average molecular weight (Mw) of the thermoplastic resin is 10000 or more.

[3] The adhesive for semiconductors according to [1] or [2], wherein the content of the thermoplastic resin is 1% to 30% by mass based on the total amount of the solid content of the adhesive for semiconductors.

[4] The adhesive for semiconductors according to any one of [1] to [3], wherein the content of the thermoplastic resin is 5% by mass or more based on the total amount of the solid content of the adhesive for semiconductors.

[5] The adhesive for semiconductors according to any one of [1] to [4], wherein the curing agent comprises an amine-based curing agent.

[6] The adhesive for semiconductors according to any one of [1] to [5], wherein the curing agent comprises an imidazole-based curing agent.

[7] The adhesive for semiconductors according to any one of [1] to [6], wherein the content of the curing agent is 2.3% by mass or less based on the total amount of the solid content of the adhesive for semiconductors.

[8] The adhesive for semiconductors according to any one of [1] to [7], wherein the melting point of the flux compound is 25° C. to 230° C.

[9] The adhesive for semiconductors according to any one of [1] to [8], wherein the melting point of the flux compound is 100° C. to 170° C.

[10] The adhesive for semiconductors according to any one of [1] to [9], wherein the thermosetting resin comprises an epoxy resin.

[11] The adhesive for semiconductors according to any one of [1] to [10], wherein the thermosetting resin substantially does not comprise an epoxy resin that is liquid at 35° C.

[12] The adhesive for semiconductors according to any one of [1] to [11], wherein the adhesive is in a film form.

[13] The adhesive for semiconductors according to any one of [1] to [12], wherein the adhesive is cured by applying heat in a pressurized atmosphere. This adhesive for semiconductors may also be used for sealing a connection part of a semiconductor chip with the cured adhesive for semiconductors that is cured by applying heat under pressurized atmosphere.

[14] The adhesive for semiconductors according to any one of [1] to [13], wherein the minimum melt viscosity of the adhesive for semiconductors is 400 to 2500 Pa·s.

[15] The adhesive for semiconductors according to any one of [1] to [14], wherein the ratio of the molar number the acid group in the entire flux compound to the molar number of the reactive group in the entire curing agent is 0.01 to 4.8.

[16] A method for producing an adhesive for semiconductors, the method comprising a step of mixing a thermoplastic resin, a thermosetting resin, a curing agent having a reactive group, and a flux compound having an acid group, wherein in the step, the curing agent and the flux compound are blended such that the ratio of the molar number of the acid group in the entire flux compound to the molar number of the reactive group in the entire curing agent is 0.01 to 4.8.

[17] The method for producing an adhesive for semiconductors according to [16], wherein the flux compound comprises at least one selected from the group consisting of a monocarboxylic acid, a dicarboxylic acid, and a tricarboxylic acid, and in the step, the curing agent and the flux compound are blended such that the ratio of the molar number of the monocarboxylic acid to the molar number of the reactive group in the entire curing agent is 0.01 to 4.8, the ratio of the molar number of the dicarboxylic acid to the molar number of the reactive group in the curing agent is 0.01 to 2.4, and the ratio of the molar number of the tricarboxylic acid to the molar number of the reactive group in the entire curing agent is 0.01 to 1.6.

[18] The method for producing an adhesive for semiconductors according to [16] or [17], wherein the weight average molecular weight (Mw) of the thermoplastic resin is 10000 or more.

[19] The method for producing an adhesive for semiconductors according to any one of [16] to [18], wherein the blending amount of the thermoplastic resin is 1% to 30% by mass based on the total amount of the solid content of the adhesive for semiconductors.

[20] The method for producing an adhesive for semiconductors according to any one of [16] to [19], wherein the blending amount of the thermoplastic resin is 5% by mass or more based on the total amount of the solid content of the adhesive for semiconductors.

[21] The method for producing an adhesive for semiconductors according to any one of [16] to [20], wherein the curing agent comprises an amine-based curing agent.

[22] The method for producing an adhesive for semiconductors according to any one of [16] to [21], wherein the curing agent comprises an imidazole-based curing agent.

[23] The method for producing an adhesive for semiconductors according to any one of [16] to [22], wherein the blending amount of the curing agent is 2.3% by mass or less based on the total amount of the solid content of the adhesive for semiconductors.

[24] The method for producing an adhesive for semiconductors according to any one of [16] to [23], wherein the melting point of the flux compound is 25° C. to 230° C.

[25] The method for producing an adhesive for semiconductors according to any one of [16] to [24], wherein the melting point of the flux compound is 100° C. to 170° C.

[26] The method for producing an adhesive for semiconductors according to any one of [16] to [25], wherein the thermosetting resin comprises an epoxy resin.

[27] The method for producing an adhesive for semiconductors according to any one of [16] to [26], wherein the thermosetting resin substantially does not comprise an epoxy resin that is liquid at 35° C.

[28] The method for producing an adhesive for semiconductors according to any one of [16] to [27], further comprising a step of molding a mixture comprising the thermoplastic resin, the thermosetting resin, the curing agent, and the flux compound into a film form.

[29] A method for producing a semiconductor device, the semiconductor device comprising a semiconductor chip and a wiring circuit board with respective connection parts thereof being electrically connected to each other, or the semiconductor device comprising a plurality of semiconductor chips with respective connection parts thereof being electrically connected to each other, the method comprising a sealing step of curing the adhesive for semiconductors according to any one of [1] to [15] by applying heat, and sealing at least a part of the connection parts thereof with the cured adhesive for semiconductors. The adhesive for semiconductors may also be cured by applying heat in pressurized atmosphere.

[30] The method for producing a semiconductor device according to [29], further comprising, before the sealing step, a temporary fixing step of disposing a plurality of semiconductor chips on a stage; and a temporary fixing step of sequentially disposing another semiconductor chip on each of the semiconductor chips disposed on the stage, with the adhesive for semiconductors interposed therebetween, while heating the stage to 60° C. to 155° C., and obtaining a plurality of laminated bodies each having the semiconductor chip, the adhesive for semiconductors, and the other semiconductor chip laminated in this order.

[31] The method for producing a semiconductor device according to [29], further comprising, before the sealing step, a step of disposing a wiring circuit board or a semiconductor wafer on a stage; and a temporary fixing step of sequentially disposing a plurality of semiconductor chips on the wiring circuit board or semiconductor wafer disposed on the stage, with the adhesive for semiconductors interposed therebetween, while heating the stage to 60° C. to 155° C., and obtaining a laminated body having the wiring circuit board, the adhesive for semiconductors, and the plurality of the semiconductor chips laminated in this order, or a laminated body having the semiconductor wafer, the adhesive for semiconductors, and the plurality of the semiconductor chips laminated in this order.

[32] A semiconductor device comprising a semiconductor chip having a connection part and a wiring circuit board having a connection part, the connection part of the semiconductor chip and the connection part of the wiring circuit board being electrically connected to each other, or a semiconductor device comprising a plurality of semiconductor chips each having a connection part, the respective connection parts of the semiconductor chips being electrically connected to each other, wherein at least a part of the connection parts is sealed by a cured product of the adhesive for semiconductors according to any one of [1] to [15] that has been cured by applying heat in pressurized atmosphere. In order words, this semiconductor device is a semiconductor device in which respective connection parts of a semiconductor chip and a wiring circuit board are electrically connected to each other, or a semiconductor device in which respective connection parts of a plurality of semiconductor chips are electrically connected to each other.

Advantageous Effects of Invention

According to an aspect of the present invention, in a process of temporarily fixing a plurality of semiconductor chips onto a mount-receiving member, with an adhesive for semiconductors interposed therebetween, and performing curing and sealing all together, voids that may remain in the adhesive for semiconductors can be reduced. According to another aspect of the present invention, an adhesive for semiconductors capable of reducing such voids, a method for producing the adhesive, a semiconductor device having such voids reduced, and a method for producing the semiconductor device can be provided.

DESCRIPTION OF EMBODIMENTS

Figure 1:
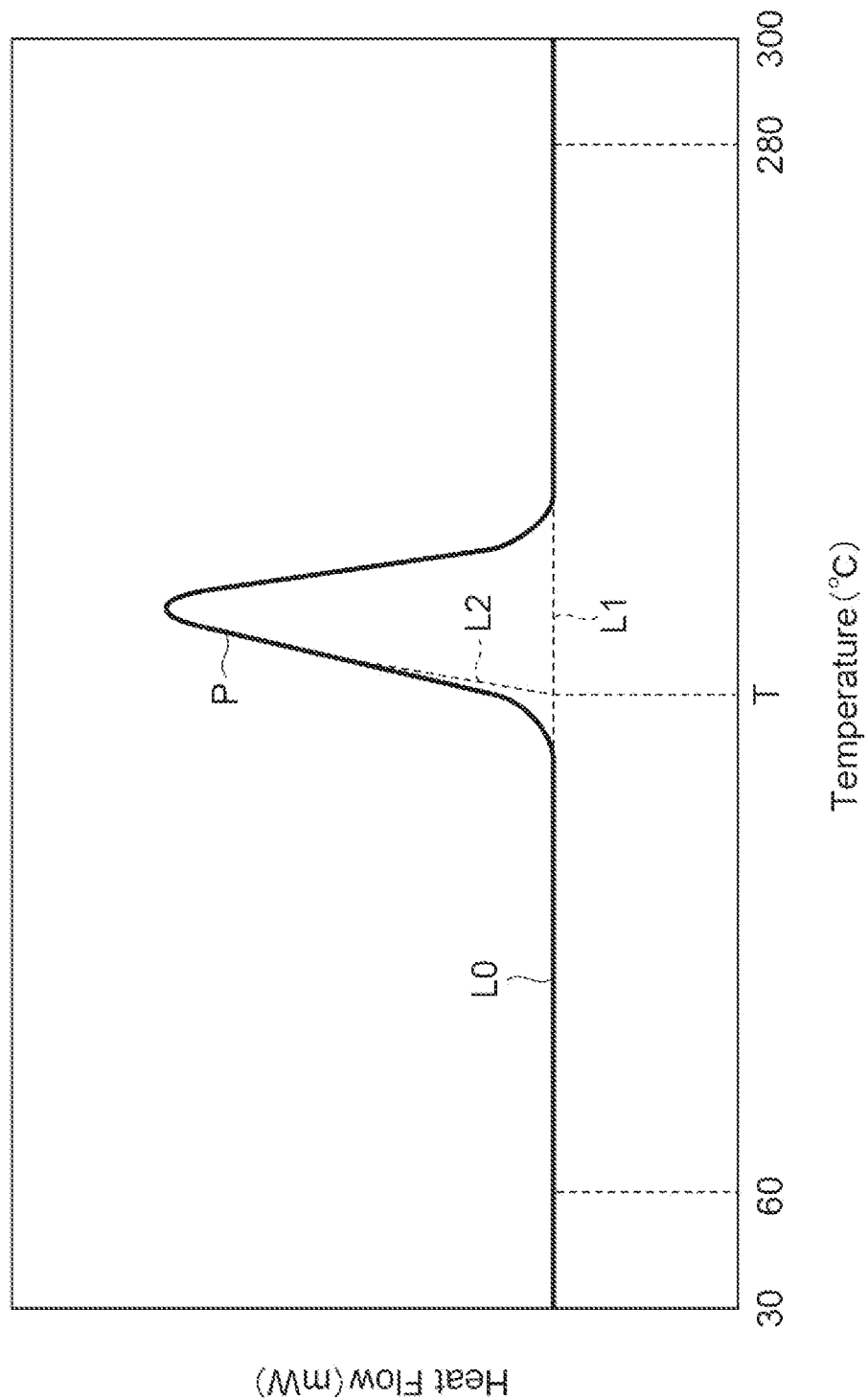
FIG. 1 is a schematic diagram illustrating a method for determining the onset temperature of an exothermic peak from a DSC curve.

Hereinafter, an embodiment of the present invention will be described in detail, with reference to the drawings depending on the circumstances. Incidentally, in the drawings, identical or equivalent portions will be assigned with an identical reference numeral, and any overlapping description will not be repeated. Furthermore, the positional relationship such as up, down, left, and right will be based on the positional relationship shown in the drawings, unless particularly stated otherwise. In addition, the dimensional ratios of the drawings are not limited to the ratios shown in the drawings.

The upper limit value and the lower limit value of a numerical value range described in the present specification can be arbitrarily combined. The numerical values described in the Examples can also be used as upper limit values or lower limit values of numerical value ranges. According to the present specification, the term "(meth)acryl" means acryl or methacryl corresponding thereto.

Adhesive for Semiconductors and Method for Producing the Same

The adhesive for semiconductors of the present embodiment contains a thermoplastic resin (hereinafter, occasionally referred to as "component (a)"), a thermosetting resin (hereinafter, occasionally referred to as "component (b)"), a curing agent having a reactive group (hereinafter, occasionally referred to as "component (c)"), and a flux compound having an acid group (hereinafter, occasionally referred to as "component (d)"). The adhesive for semiconductors of the present embodiment may contain a filler (hereinafter, occasionally referred to as "component (e)"), as necessary.

The calorific value at 60° C. to 155° C. on a DSC curve obtained by Differential scanning calorimetry (DSC) of the adhesive for semiconductors of the present embodiment is 20 J/g or less. Here, differential scanning calorimetry is carried out by adjusting the weight of the adhesive for semiconductors serving as a sample to 10 mg, setting the measurement temperature range to 30° C. to 300° C., and heating the adhesive for semiconductors in an air or nitrogen atmosphere at a rate of temperature increase of 10° C./min. The calorific value is calculated by integrating the peak area.

Conventional adhesives for semiconductors have an exothermic peak in the temperature range of 60° C. to 155° C. on the DSC curve. Heat generation in this temperature range is inferred to be heat generation originating from a reaction between the thermosetting resin and the flux compound in the adhesive for semiconductors, and it is inferred that when this reaction proceeds, the adhesive for semiconductors is partially cured so that fluidity is lowered. On the other hand, usually, temporary fixing of a semiconductor chip by the adhesive for semiconductors is carried out by heating the adhesive for semiconductors to, for example, 60° C. to 155° C. to cause the adhesive for semiconductors to appropriately flow. Therefore, when a conventional adhesive for semiconductors is used in a process of mounting a plurality of semiconductor chips on a mounting-receiving member (a semiconductor chip, a semiconductor wafer, a wiring circuit board, or the like), with the adhesive for semiconductors interposed therebetween, and then performing curing and sealing all together under pressurized conditions, it is inferred that at the time of temporarily fixing the semiconductor chip, the thermosetting resin and the flux compound in the adhesive for semiconductors react with each other to partially proceed curing of the adhesive for semiconductors, and the adhesive for semiconductors does not sufficiently flow at the time of curing all together under pressurized conditions. Since the adhesive for semiconductors of the present embodiment has a calorific value at 60° C. to 155° C. on the DSC curve of 20 J/g or less, curing in the temperature range where temporary fixing of the semiconductor chips (for example, 60° C. to 155° C.) is not likely to proceed. Therefore, a plurality of semiconductor chips can be temporarily fixed while maintaining sufficient fluidity of the adhesive for semiconductors, by using the adhesive for semiconductors of the present embodiment in the above-described process, which makes it possible to reduce the generation of voids at the time of curing all together. In addition, as a result of reducing the generation of voids, even if heating is achieved to a temperature higher than or equal to the melting point of the connection parts (for example, 260° C.) in a reflow step, it is expected that inconveniences (peeling of the adhesive for semiconductors, electrical connection failure at the connection parts, and the like) are not likely to occur. That is, according to the adhesive for semiconductors of the present embodiment, there is a tendency that the reflow reliability (reflow resistance) in the production of a semiconductor device can be enhanced.

The calorific value at 60° C. to 155° C. on the DSC curve may be 15 J/g or less or 10 J/g or less, from the viewpoint that the effects of the present invention are easily obtained. The calorific value at 60° C. to 155° C. on the DSC curve may be 20% or less, 15% or less, or 10% or less of the calorific value at 60° C. to 280° C., from the viewpoint that the effects of the present invention are easily obtained. From the viewpoint that the effects of the present invention are easily obtained, the calorific value at 60° C. to 280° C. on the DSC curve may be 50 J/g or more or 100 J/g or more, may be 200 J/g or less or 180 J/g or less, or may be 50 to 200 J/g, 100 to 200 J/g, or 100 to 180 J/g. From the viewpoint that the effects of the present invention are easily obtained, the DSC curve may not have an exothermic peak whose onset temperature is 155° C. or lower.

FIG. 1 is a schematic diagram illustrating a method for determining the onset temperature of an exothermic peak from a DSC curve. The DSC curve shown in FIG. 1 includes a baseline L0 and an exothermic peak P induced by a curing reaction of an adhesive, the exothermic peak being observed in the middle of the baseline L0, in the temperature range of 60° C. to 280° C. The temperature T at the intersection of an extension line L1 of the baseline L0 in the lower part of the exothermic peak P and a tangent line L2 of the DSC curve at a point where the DSC curve exhibits the maximum gradient at the exothermic peak P, is the onset temperature.

Figure 2:
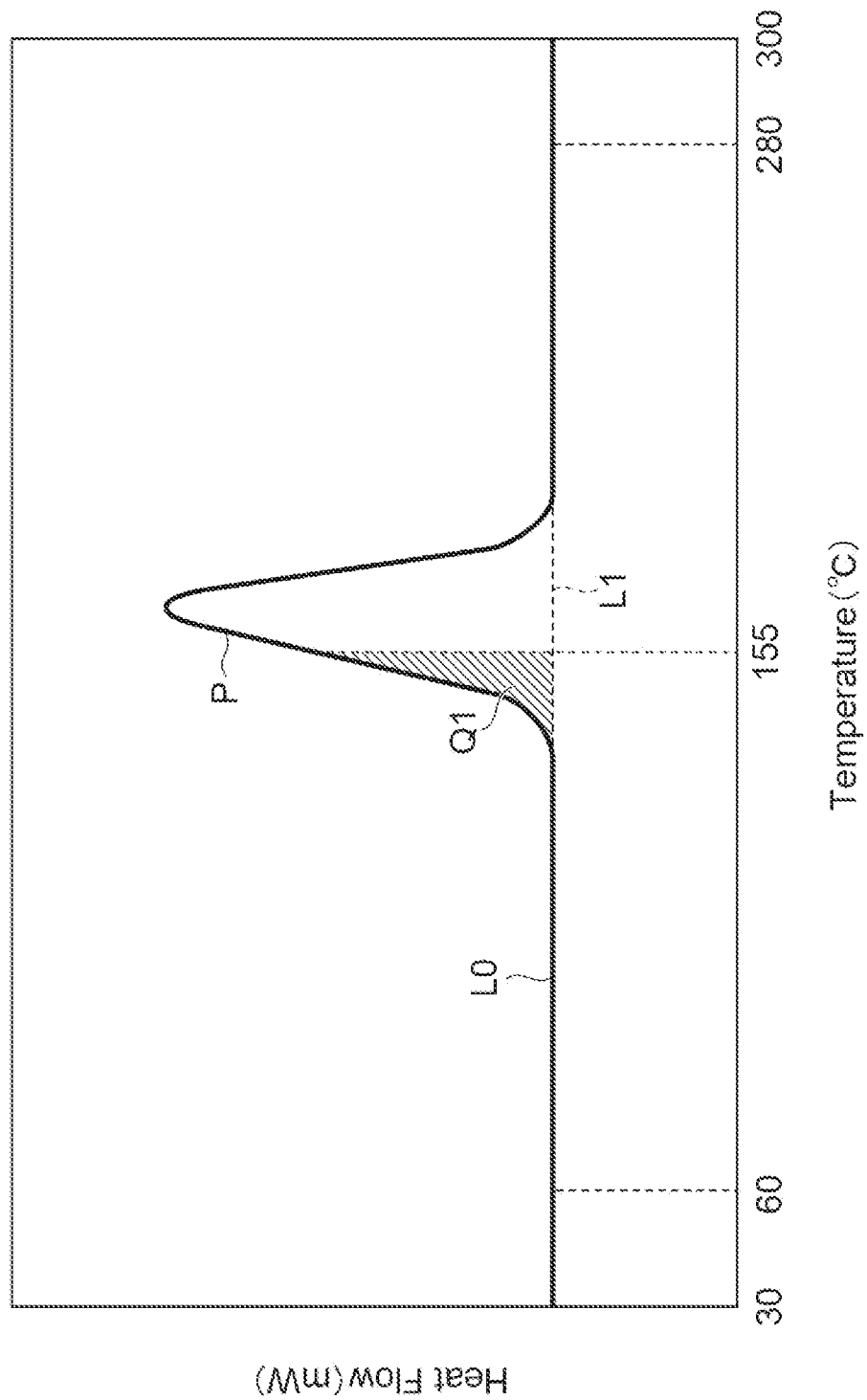
FIG. 2 is a schematic diagram illustrating a method for determining the calorific value at 60° C. to 155° C. from a DSC curve.
Figure 3:
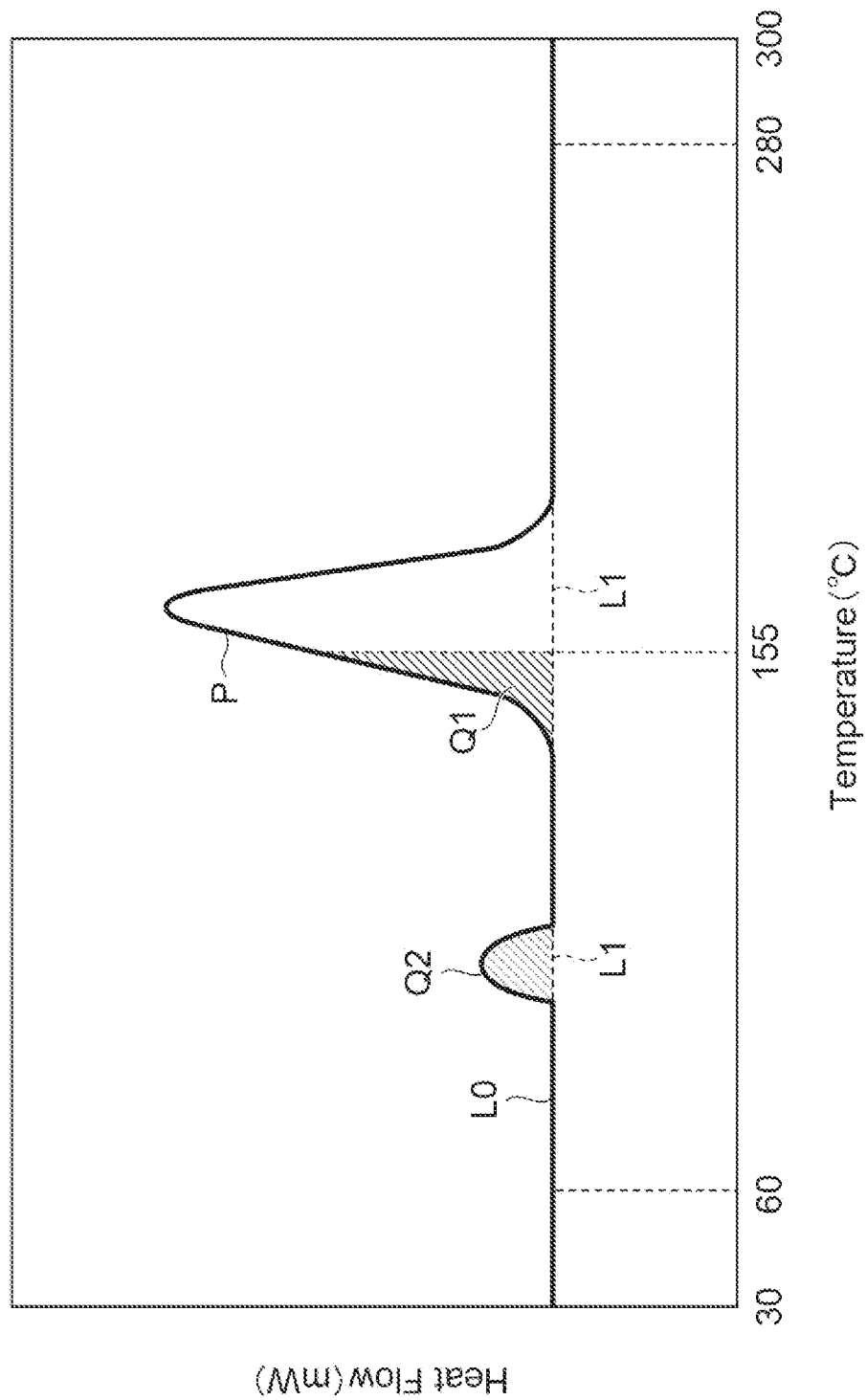
FIG. 3 is a schematic diagram illustrating a method for determining the calorific value at 60° C. to 155° C. from a DSC curve.

FIG. 2 and FIG. 3 are schematic diagrams illustrating a method for determining the calorific value at 60° C. to 155° C. from a DSC curve. As in FIG. 2, when the DSC curve includes only an exothermic peak P including the portion at 155° C. or lower as the exothermic peak, the calorific value Q1 of the portion at 155° C. or lower in the exothermic peak P is the calorific value at 60° C. to 155° C. The calorific value Q1 can be determined from the area in the range of 155° C. or lower, which is surrounded by the exothermic peak P and an extension line L1 of the baseline L0. As in FIG. 3, when the DSC curve further includes a peak other than the exothermic peak P in the range of 155° C. or lower, the total sum of the calorific value Q2 of that peak and the calorific value Q1 at 155° C. or lower of the exothermic peak P is the calorific value at 60° C. to 155° C. When more exothermic peaks are observed in the range of 60° C. to 155° C. or lower, the calorific value obtained by adding all of the calorific values of those exothermic peaks is the calorific value at 60° C. to 155° C.

The adhesive for semiconductors of the present embodiment showing the above-described DSC curve can be obtained by, for example, blending a curing agent and a flux compound such that the ratio of the molar number of an acid group in the entire flux compound to the molar number of a reactive group, which is a group that reacts with the acid group of the flux compound, in the entire curing agent is 0.01 to 4.8. That is, the method for producing an adhesive for semiconductors of the present embodiment comprises a step of mixing a thermoplastic resin, a thermosetting resin, a curing agent having a reactive group, and a flux compound having an acid group, and in this step, the curing agent and the flux compound are blended such that the ratio of the molar number of the acid group in the entire flux compound to the molar number of the reactive group in the entire curing agent is 0.01 to 4.8. In the adhesive for semiconductors obtainable according to this method, usually, the ratio of the molar number of the acid group in the total amount of the flux compound to the molar number of the reactive group in the entire curing agent is 0.01 to 4.8. However, a part of the reactive group of the curing agent and the acid group of the flux compound may form a salt. The ratio of the molar numbers including the numbers of the reactive group and the acid group forming the salt may be in the above-described range.

The present inventors infer the reason why an adhesive for semiconductors showing the above-described DSC curve is obtained by adjusting the molar ratio of the curing agent and the flux compound to the above-described range, as follows. That is, as described above, in the temperature range of 60° C. to 155° C., the thermosetting resin and the flux compound in the adhesive for semiconductors react with each other. However, when the molar ratio of the curing agent and the flux compound is in the above-described range, it is inferred that the flux compound can form a salt with the curing agent before reacting with the thermosetting resin and can be stabilized. Therefore, it is inferred that the reaction between the thermosetting resin and the flux compound is suppressed, and consequently, an adhesive for semiconductors showing the above-described DSC curve is obtained.

In the following description, the various components constituting the adhesive for semiconductors of the present embodiment will be described.

(a) Thermoplastic Resin

The component (a) is not particularly limited; however, examples include a phenoxy resin, a polyimide resin, a polyamide resin, a polycarbodiimide resin, a cyanate ester resin, an acrylic resin, a polyester resin, a polyethylene resin, a polyethersulfone resin, a polyetherimide resin, a polyvinyl acetal resin, a urethane resin, and an acrylic rubber. Among these, from the viewpoint of having excellent heat resistance and film-forming properties, the thermoplastic resin may be selected from a phenoxy resin, a polyimide resin, an acrylic resin, an acrylic rubber, a cyanate ester resin, and a polycarbodiimide resin, or may be selected from a phenoxy resin, a polyimide resin, and an acrylic resin. These components (a) can be used singly or can be used as a mixture or a copolymer of two or more kinds thereof.

The weight average molecular weight (Mw) of the component (a) may be 10000 or more, 40000 or more, or 60000 or more. According to such a component (a), the film-forming properties and the heat resistance of the adhesive can be further enhanced. When the weight average molecular weight is 10000 or more, since flexibility can be easily imparted to the adhesive for semiconductors in a film form, superior processability is likely to be obtained. The weight average molecular weight of the component (a) may be 1000000 or less or 500000 or less. According to such a component (a), since the viscosity of the film is lowered, satisfactory embeddability into bumps is obtained, and packaging can be achieved in a further void-free manner. From these viewpoints, the weight average molecular weight of the component (a) may be 10000 to 1000000, 40000 to 500000, or 60000 to 500000.

According to the present specification, the above-described weight average molecular weight represents the weight average molecular weight measured using GPC (Gel Permeation Chromatography) and calculated relative to polystyrene standards. An example of the measurement conditions for the GPC method will be described below.

Apparatus: HCL-8320GPC, UV-8320 (product name, manufactured by Tosoh Corporation), or HPLC-8020 (product name, manufactured by Tosoh Corporation)

Column: TSKgel superMultipore HZ-M×2, or 2 pieces of GMHXL+1 piece of G-2000XL

Detector: RI or UV detector

Column temperature: 25° C. to 40° C.

Eluent: A solvent in which the polymer components are dissolved is selected. Examples of the solvent include THF (tetrahydrofuran), DMF (N,N-dimethylformamide), DMA (N,N-dimethylacetamide), NMP (N-methylpyrrolidone), and toluene. Incidentally, in the case of selecting a solvent having polarity, the concentration of phosphoric acid may be adjusted to 0.05 to 0.1 mol/L (usually 0.06 mol/L), and the concentration of LiBr may be adjusted to 0.5 to 1.0 mol/L (usually 0.63 mol/L).

Flow rate: 0.30 to 1.5 mL/min.

Standard substance: Polystyrene

The ratio $C_b/C_a$ (mass ratio) of the content $C_b$ of the component (b) to the content $C_a$ of the component (a) may be 0.01 or more, 0.1 or more, or 1 or more, and may be 5 or less, 4.5 or less, or 4 or less. By adjusting the ratio $C_b/C_a$ to 0.01 or more, more satisfactory curability and adhesive force are obtained. By adjusting the ratio $C_b/C_a$ to 5 or less, more satisfactory film-forming properties are obtained. From these viewpoints, the ratio $C_b/C_a$ may be 0.01 to 5, 0.1 to 4.5, or 1 to 4.

From the viewpoint of enhancing the connection reliability or the like, the glass transition temperature of the component (a) may be −50° C. or higher, −40° C. or higher, or −30° C. or higher. From the viewpoint of lamination properties or the like, the glass transition temperature of the component (a) may be 220° C. or lower, 200° C. or lower, or 180° C. or lower. The glass transition temperature of the component (a) may be −50° C. to 220° C., −40° C. to 200° C., or −30° C. to 180° C. According to an adhesive for semiconductors containing such a component (a), on the occasion of a packaging process at a wafer level, the amount of wafer warpage can be further reduced, and at the same time, heat resistance and film-forming properties of the adhesive for semiconductors can be further enhanced. The glass transition temperature of the component (a) can be measured using a differential scanning calorimeter (DSC).

The content of the component (a) may be 30% by mass or less, 25% by mass or less, or 20% by mass or less, based on the total amount of the solid content of the adhesive for semiconductors. When the content of the component (a) is 30% by mass or less, the adhesive for semiconductors can obtain satisfactory reliability during a temperature cycle test and can obtain satisfactory adhesive force at a reflow temperature of approximately 260° C. even after moisture absorption. The content of the component (a) may be 1% by mass or more, 3% by mass or more, or 5% by mass or more, based on the total amount of the solid content of the adhesive for semiconductors. When the content of the component (a) is 1% by mass or more, on the occasion of a packaging process at a wafer level of the adhesive for semiconductors, the amount of wafer warpage can be further reduced, and at the same time, heat resistance and film-forming properties of the adhesive for semiconductors can be further enhanced. When the content of the component (a) is 5% by mass or more, the occurrence of burring and chipping at the time of outline machining into a wafer shape can be suppressed. From the viewpoint described above and from the viewpoint that flexibility is easily imparted to the adhesive form semiconductors in a film form and superior processability is easily obtained, the content of the component (a) may be 1% to 30% by mass, 3% to 30% by mass, or 5% to 30% by mass, based on the total amount of the solid content of the adhesive or semiconductors. The term "total amount of the solid content of the adhesive for semiconductors" is the amount obtained by excluding the amount of the solvent contained in the adhesive for semiconductors from the total amount of the adhesive for semiconductors. In the present specification, the "total amount of the solid content of the adhesive for semiconductors" may be replaced with the "total sum amount of the component (a), component (b), component (c), compound (d), and component (e)".

(b) Thermosetting Resin

Regarding the component (b), any compound having two or more reactive groups in the molecule can be used without particular limitation. As the adhesive for semiconductors contains a thermosetting resin, the adhesive can be cured by heating, the cured adhesive exhibits high heat resistance and adhesive force to a chip, and excellent reflow resistance is obtained.

Examples of the component (b) include an epoxy resin, a phenol resin, an imide resin, a urea resin, a melamine resin, a silicon resin, a (meth)acrylic compound, and a vinyl compound. From the viewpoint of having excellent heat resistance (reflow resistance) and storage stability, the thermosetting resin may be selected from an epoxy resin, a phenol resin, and an imide resin, may be selected from an epoxy resin and an imide resin, or may be an epoxy resin. These components (b) can be used singly or can be used as mixtures or copolymers of two or more kinds thereof. In a conventional adhesive for semiconductors, particularly when a thermosetting resin is an epoxy resin, a melamine resin, or a urea resin, the reaction with the flux compound that will be described below is likely to proceed in the temperature range of 60° C. to 155° C., and partial curing tends to proceed before curing all together; however, in the present embodiment, even in a case where the thermosetting resin contains at least one resin selected from the group consisting of an epoxy resin, a melamine resin, and a urea resin, such a reaction and partial curing are not likely to occur.

Examples of the epoxy resin and the imide resin include a bisphenol A type epoxy resin, a bisphenol F type epoxy resin, a naphthalene type epoxy resin, a phenol novolac type epoxy resin, a cresol novolac type epoxy resin, a phenol aralkyl type epoxy resin, a biphenyl type epoxy resin, a triphenylmethane type epoxy resin, a dicyclopentadiene type epoxy resin, and various polyfunctional epoxy resins; a nadimide resin, an allyl nadimide resin, a maleimide resin, an amideimide resin, an imide acrylate resin, various polyfunctional imide resins, and various polyimide resins. These can be used singly or as mixtures of two or more kinds thereof.

From the viewpoint of being degraded at the time of connection at a high temperature to suppress the occurrence of volatile components, when the temperature at the time of connection is 250° C., the component (b) may be a compound having a thermal weight reduction rate at 250° C. of 5% or less, and when the temperature at the time of connection is 300° C., the component (b) may be a compound having a thermal weight reduction rate at 300° C. of 5% or less.

The component (b) does not substantially have to contain an epoxy resin that is liquid at 35° C. For example, the content of the epoxy resin that is liquid at 35° C. may be 0.1 parts by mass or less with respect to 100 parts by mass of the component (b). In this case, since packaging can be achieved without having the liquid epoxy resin degraded and volatilized during thermocompression bonding, and outgas contamination of the periphery of the chip is suppressed, a semiconductor package is likely to be obtained at a superior throughput.

The content of the component (b) is, for example, 5% by mass or more based on the total amount of the solid content of the adhesive for semiconductors and may be 15% by mass or more or 30% by mass or more. The content of the component (b) is, for example, 80% by mass or less based on the total amount of the solid content of the adhesive for semiconductors and may be 70% by mass or less or 60% by mass or less. The content of the component (b) is, for example, 5% to 80% by mass based on the total amount of the solid content of the adhesive for semiconductors and may be 15% to 70% by mass or 30% to 60% by mass.

(c) Curing Agent

The component (c) is a compound that reacts with a reactive group of the thermosetting resin or promotes a curing reaction of the thermosetting resin, and may be a compound having a reactive group capable of forming a salt with the fluxing agent that will be described below. Examples of the component (c) include an amine-based curing agent, which is a compound having an amino group as a reactive group, and an imidazole-based curing agent, which is a compound having an imidazole group as a reactive group. When the component (c) contains an amine-based curing agent or an imidazole-based curing agent, the component (c) exhibits flux activity of suppressing the generation of an oxide film at the connection parts and can enhance the connection reliability and insulation reliability. When the component contains an amine-based curing agent or an imidazole-based curing agent, storage stability is further enhanced, and there is a tendency that degradation or deterioration caused by moisture absorption is not likely to occur. When the component (c) contains an amine-based curing agent or an imidazole-based curing agent, adjustment of the curing rate is facilitated, and the realization of short-term connection aimed at productivity enhancement is facilitated due to rapid curability.

In the following description, each of the curing agents will be described.

(i) Amine-Based Curing Agent

As the amine-based curing agent, for example, dicyandiamide can be used.

The content of the amine-based curing agent may be 0.1 parts by mass or more and 10 parts by mass or less or 5 parts by mass or less, with respect to 100 parts by mass of the component (b). When the content of the amine-based curing agent is 0.1 parts by mass or more, curability tends to be enhanced. When the content of the amine-based curing agent is 10 parts by mass or less, the adhesive for semiconductors does not cure before metal bonding is formed, and there is a tendency that connection failure is not likely to occur. From these viewpoints, the content of the amine-based curing agent may be 0.1 to 10 parts by mass or 0.1 to 5 parts by mass with respect to 100 parts by mass of the component (b).

(ii) Imidazole-Based Curing Agent

Examples of the imidazole-based curing agent include 2-phenylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, and an adduct of an epoxy resin and an imidazole. From the viewpoints of excellent curability, storage stability, and connection reliability, the imidazole-based curing agent may be selected from 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, and 2-phenyl-4-methyl-5-hydroxymethylimidazole. These can be used singly or in combination of two or more kinds thereof. A microcapsule containing these may also be used as a latent curing agent.

The content of the imidazole-based curing agent is 0.1 parts by mass or more and 10 parts by mass or less, 5 parts by mass or less, or 2.3 parts by mass or less, with respect to 100 parts by mass of the component (b). When the content of the imidazole-based curing agent is 0.1 parts by mass or more, curability tends to be enhanced. When the content of the imidazole-based curing agent is 10 parts by mass or less, the adhesive for semiconductors does not cure before metal bonding is formed, connection failure is not likely to occur, and the generation of voids is easily suppressed in the curing process under a pressurized atmosphere. From these viewpoints, the content of the imidazole-based curing agent may be 0.1 to 10 parts by mass, 0.1 to 5 parts by mass, or 0.1 to 2.3 parts by mass, with respect to 100 parts by mass of the component (b).

The components (c) can be used each singly or as a mixture of two or more kinds thereof. For example, the imidazole-based curing agent may be used alone or may be used together with an amine-based curing agent. As the component (c), any curing agent other than the above-described ones, which functions as a curing agent for the component (b), can also be used.

The content of the component (c) may be 0.5 parts by mass or more and 20 parts by mass or less, 6 parts by mass or less, or 4 parts by mass or less, with respect to 100 parts by mass of the component (b). When the content of the component (c) is 0.5 parts by mass or more, curing tends to proceed sufficiently. When the content of the component (c) is 20 parts by mass or less, there is a tendency that rapid progress of curing and concomitant increase in the number of reaction sites can be suppressed, and that deterioration of reliability due to shortening of the molecular chain or remaining of unreacted groups can be prevented, and in addition, it is easier to suppress voids from remaining during curing in a pressurized atmosphere. From these viewpoints, the content of the component (c) may be 0.2 to 20 parts by mass, 0.5 to 6 parts by mass, or 0.5 to 4 parts by mass, with respect to 100 parts by mass of the component (b).

The content of the component (c) may be 0.5% by mass or more and 2.3% by mass or less, 2.0% by mass or less, or 1.5% by mass or less, based on the total amount of the solid content of the adhesive for semiconductors. When the content of the component (c) is 0.5% by mass or more, curing tends to proceed sufficiently. When the content of the component (c) is 2.3% by mass or less, there is a tendency that rapid progress of curing and concomitant increase in the number of reaction sites can be suppressed, and that deterioration of reliability due to shortening of the molecular chain or remaining of unreacted groups can be prevented, and in addition, it is easier to suppress voids from remaining during curing in a pressurized atmosphere. From these viewpoints, the content of the component (c) may be 0.5% to 2.3% by mass or 0.5% to 2.0% by mass, based on the total amount of the solid content of the adhesive for semiconductors.

When the adhesive for semiconductors contains an amine-based curing agent as the component (c), the adhesive for semiconductors exhibits flux activity of removing an oxide film, and the connection reliability can be further enhanced.

(d) Flux Compound

The component (d) is a compound having flux activity (activity of removing oxides and impurities) and is an organic acid, for example. When the adhesive for semiconductors contains the component (d), since an oxide film of the metal at the connection parts and a coating formed by an OSP treatment can be removed, excellent connection reliability is likely to be obtained. Regarding the component (d), one kind of flux compound (for example, an organic acid) may be used alone, or two or more kinds of flux compounds (for example, organic acids) may be used in combination.

The component (d) has one or more acid groups. The acid group is, for example, a carboxyl group. When the component (d) is a compound having a carboxyl group (for example, a carboxylic acid), superior connection reliability is likely to be obtained. When the component (d) is a compound having a carboxyl group (for example, a carboxylic acid), from the viewpoint that the effects of the present invention are easily obtained, the component (b) may be at least one thermosetting resin selected from the group consisting of an epoxy resin, a urethane resin, and a urea resin, or the component (c) may be at least one curing agent selected from the group consisting of an amine-based curing agent and an imidazole-based curing agent.

Examples of the compound having a carboxyl group include a compound having a group represented by the following Formula (1):

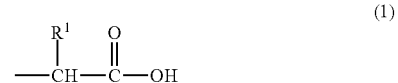

wherein in Formula (1), $R^1$ represents a hydrogen atom or an electron-donating group.

Examples of the electron-donating group include an alkyl group, a hydroxyl group, an amino group, an alkoxy group, and an alkylamino group.

The alkyl group may be an alkyl group having 1 to 10 carbon atoms or an alkyl group having 1 to 5 carbon atoms. When the number of carbon atoms of the alkyl group is in the above-described range, an excellent balance between the electron donating properties and the steric hindrance is achieved.

The alkyl group may be a linear or branched group and may be a linear group. When the alkyl group is a linear group, from the viewpoint of the balance between the electron donating properties and the steric hindrance, the number of carbon atoms of the alkyl group may be equal to or smaller than the number of carbon atoms of the main chain of the flux compound.

The alkoxy group may be an alkoxy group having 1 to 10 carbon atoms or an alkoxy group having 1 to 5 carbon atoms. When the number of carbon atoms of the alkoxy group is in the above-described range, an excellent balance between the electron donating properties and the steric hindrance is achieved.

The alkyl group moiety of the alkoxy group may be a linear or branched moiety and may be a linear moiety. When the alkoxy group is a linear group, from the viewpoint of the balance between the electron donating properties and the steric hindrance, the number of carbon atoms of the alkoxy group may be equal to or smaller than the number of carbon atoms of the main chain of the flux compound.

Examples of the alkylamino group include a monoalkylamino group and a dialkylamino group. The monoalkylamino group may be a monoalkylamino group having 1 to 10 carbon atoms or a monoalkylamino group having 1 to 5 carbon atoms. The alkyl group moiety of the monoalkylamino group may be a linear or branched moiety and may be a linear moiety. The dialkylamino group may be a dialkylamino group having 2 to 20 carbon atoms or a dialkylamino group having 2 to 10 carbon atoms. The alkyl group moiety of the dialkylamino group may be a linear or branched moiety and may be a linear moiety.

The component (d) may be a compound having one to three acid groups and may be a compound having one to three carboxyl groups as the acid groups. The component (d) may contain at least one selected from the group consisting of a monocarboxylic acid, a dicarboxylic acid, and a tricarboxylic acid. When a compound (d) having one to three carboxyl groups is used, an increase in the viscosity of the adhesive for semiconductors during storage, during connection work, and the like can be further suppressed, and the connection reliability of the semiconductor device can be further enhanced, as compared to the case of using a compound having four or more carboxyl groups.

The component (d) may contain a monocarboxylic acid. For example, when the thermosetting resin is an epoxy resin, a urethane resin, or a urea resin, a part of the component (b) and a part of the component (d) react with each other and produce an ester at the time of performing heat-induced polymerization (curing); however, when a compound having one carboxyl group is used, an ester bond derived from this ester is not likely to be present in the polymerized main chain. For that reason, even if ester hydrolysis has occurred due to moisture absorption, the molecular chain is not reduced to a large extent. The adhesive force after moisture absorption (for example, adhesive force to silicon) and the bulk strength of the cured product can be maintained at high levels, and the reflow resistance and connection reliability of the semiconductor device can be further enhanced.

The melting point of the component (d) may be 25° C. or higher, 90° C. or higher, or 100° C. or higher and may be 230° C. or lower, 180° C. or lower, 170° C. or lower, or 160° C. or lower. When the melting point of the component (d) is 230° C. or lower, the flux activity is likely to be sufficiently exhibited before a curing reaction between the thermosetting resin and the curing agent occurs. For that reason, according to an adhesive for semiconductors containing such a component (d), the component (d) melts during chip mounting, the oxide film at the solder surface is removed, and thereby a semiconductor device having superior connection reliability can be realized. Furthermore, when the melting point of the component (d) is 25° C. or higher, it is difficult to initiate the reaction at room temperature, and superior storage stability is obtained. From these viewpoints, the melting point of the component (d) may be 25° C. to 230° C., 90° C. to 180° C. or lower, 100° C. to 170° C., or 100° C. to 160° C.

The melting point of the component (d) can be measured using a general melting point measuring apparatus. Regarding a sample whose melting point is to be measured, it is required to reduce the deviation of temperature in the sample by pulverizing the sample into a fine powder and using a trace amount thereof. Regarding the container for the sample, a capillary tube having one end closed is frequently used; however, depending on the measuring apparatus, the sample may be interposed between two sheets of cover glasses for microscopy as the container. When the temperature is rapidly increased, a temperature ingredient occurs between the sample and the thermometer to produce measurement errors, and therefore, it is desirable to measure the heating at the time point of measuring the melting point, at an increase rate of 1° C. or less per minute.

Since the sample is prepared as a fine powder as described above, the sample before melting is opaque due to diffused reflection at the surface. It is conventional to define the temperature at which the external appearance of the sample begins to become transparent as the lower limit point of the melting point, and to define the temperature at which the sample has finished melting as the upper limit point. There are various types of measuring apparatuses; however, the most classical apparatus used is an apparatus in which a capillary tube filled with a sample is attached to a double-tube type thermometer and is heated in a warm bath. For the purpose of attaching a capillary tube to a double-tube type thermometer, a highly viscous liquid is used as the liquid of the warm bath so that concentrated sulfuric acid or silicon oil is frequently used, and the capillary tube is attached such that the sample comes close to the bulb at the tip of the thermometer. Regarding the melting point measuring apparatus, an apparatus that heats using a metal heat block and automatically determines the melting point while regulating heating while measuring the light transmittance can also be used.

In the present specification, when it is said that the melting point is 230° C. or lower, it is meant that the upper limit point of the melting point is 230° C. or lower, and when it is said that the melting point is 25° C. or higher, it is meant that the lower limit point of the melting point is 25° C. or higher.

Specific examples of the component (d) include malonic acid, methylmalonic acid, dimethylmalonic acid, ethylmalonic acid, allylmalonic acid, 2,2'-thiodiacetic acid, 3,3'-thiodipropionic acid, 2,2'-(ethylenedithio)diacetic acid, 3,3'-dithiodipropionic acid, 2-ethyl-2-hydroxybutyric acid, dithiodiglycolic acid, diglycolic acid, acetylenedicarboxylic acid, maleic acid, malic acid, 2-isopropylmalic acid, tartaric acid, itaconic acid, 1,3-acetonedicarboxylic acid, tricarballylic acid, muconic acid, β-hydromuconic acid, succinic acid, methylsuccinic acid, dimethylsuccinic acid, glutaric acid, α-ketoglutaric acid, 2-methylglutaric acid, 3-methylglutaric acid, 2,2-dimethylglutaric acid, 3,3-dimethylglutaric acid, 2,2-bis(hydroxymethyl)propionic acid, citric acid, adipic acid, 3-tert-butyladipic acid, pimelic acid, phenyloxalic acid, phenylacetic acid, nitrophenylacetic acid, phenoxyacetic acid, nitrophenoxyacetic acid, phenylthioacetic acid, hydroxyphenylacetic acid, dihydroxyphenylacetic acid, mandelic acid, hydroxymandelic acid, dihydroxymandelic acid, 1,2,3,4-butanetetracarboxylic acid, suberic acid, 4,4'-dithiodibutyric acid, cinnamic acid, nitrocinnamic acid, hydroxycinnamic acid, dihydroxycinnamic acid, coumaric acid, phenylpyruvic acid, hydroxyphenylpyruvic acid, caffeic acid, homophthalic acid, tolylacetic acid, phenoxypropionic acid, hydroxyphenylpropionic acid, benzyloxyacetic acid, phenyllactic acid, tropic acid, 3-(phenylsulfonyl)propionic acid, 3,3-tetramethyleneglutaric acid, 5-oxoazelaic acid, azelaic acid, phenylsuccinic acid, 1,2-phenylenediacetic acid, 1,3-phenylenediacetic acid, 1,4-phenylenediacetic acid, benzylmalonic acid, sebacic acid, dodecanedioic acid, undecanedioic acid, diphenylacetic acid, benzilic acid, dicyclohexylacetic acid, tetradecanedioic acid, 2,2-diphenylpropionic acid, 3,3-diphenylpropionic acid, 4,4-bis(4-hydroxyphenyl)valeric acid (diphenolic acid), pimaric acid, palustric acid, isopimaric acid, abietic acid, dehydroabietic acid, neoabietic acid, agathic acid, benzoic acid, 2-hydroxybenzoic acid, 3-hydroxybenzoic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 2,3,4-trihydroxybenzoic acid, 2,4,6-trihydroxybenzoic acid, 3,4,5-trihydroxybenzoic acid, 1,2,3-benzenetricarboxylic acid, 1,2,4-benzenetricarboxylic acid, 1,3,5-benzenetricarboxylic acid, 2-[bis(4-hydroxyphenyl)methyl]benzoic acid, 1-naphthoic acid, 2-naphthoic acid, 1-hydroxy-2-naphthoic acid, 2-hydroxy-1-naphthoic acid, 3-hydroxy-2-naphthoic acid, 6-hydroxy-2-naphthoic acid, 1,4-dihydroxy-2-naphthoic acid, 3,5-dihydroxy-2-naphthoic acid, 3,7-dihydroxy-2-naphthoic acid, 2,3-naphthalenedicarboxylic acid, 2,6-naphthalenedicarboxylic acid, 2-phenoxybenzoic acid, biphenyl-4-carboxylic acid, biphenyl-2-carboxylic acid, and 2-benzoylbenzoic acid. From the viewpoint that excellent flux activity is likely to be obtained and from the viewpoint that the effects of the present invention are likely to be obtained, the component (d) may contain benzilic acid, diphenylacetic acid, or a combination of these.

The content of the component (d) may be 0.1% by mass or more and 10% by mass or less, 5% by mass or less, or 2% by mass or less, based on the total amount of the solid content of the adhesive for semiconductors. From the viewpoints of the connection reliability and reflow resistance during the production of a semiconductor device, the content of the component (d) may be 0.1% to 10% by mass, 0.1% to 5% by mass, or 0.1% to 2% by mass, based on the total amount of the solid content of the adhesive for semiconductors. When the compound having flux activity corresponds to the components (a) to (c), the content of the component (d) is calculated assuming that this compound also corresponds to the component (d). The same also applies to the molar number of the acid group that will be described below and the like.

According to the present embodiment, the ratio of the molar number of the acid group in the entire component (d) to the molar number of the reactive group in the total component (c) may be 0.01 or more or 4.8 or less. The molar ratio may be 0.1 or more, 0.5 or more, 4.0 or less, or 3.0 or less. Apart of the reactive groups in the component (c) and the acid groups in the component (d) may form a salt, and in that case, the ratio of the molar numbers including the number of the reactive groups and the acid groups that form a salt may be in the above-described range.

When the component (d) contains at least one selected from the group consisting of a monocarboxylic acid, a dicarboxylic acid, and a tricarboxylic acid, the ratio of the molar number of the acid group in the entire component (d) to the molar number of the reactive group in the entire component (c) is 0.01 to 4.8, and the ratio of the molar number of the monocarboxylic acid to the molar number of the reactive group in the entire component (c) may be 0.01 to 4.8, the ratio of the molar number of the dicarboxylic acid to the molar number of the reactive group in the entire component (c) may be 0.01 to 2.4, and the ratio of the molar number of the tricarboxylic acid to the molar number of the reactive group in the entire component (c) may be 0.01 to 1.6. It is also acceptable that the ratio of the molar number of the monocarboxylic acid to the molar number of the reactive group in the entire component (c) is 0.5 to 3.0, the ratio of the molar number of the dicarboxylic acid to the molar number of the reactive group in the entire component (c) is 0.25 to 1.5, and the ratio of the molar number of the tricarboxylic acid to the molar number of the reactive group in the entire component (c) is 0.5/3 to 1.0.

(e) Filler

The adhesive for semiconductors of the present embodiment may contain a filler (component (e)) as necessary. The viscosity of the adhesive for semiconductors, the physical properties of a cured product of the adhesive for semiconductors, and the like can be controlled by the component (e). Specifically, according to the component (e), for example, suppression of the generation of voids during connection, lowering of the coefficient of moisture absorption of a cured product of the adhesive for semiconductors, and the like can be promoted.

As the component (e), an insulating inorganic filler, whiskers, a resin filler, and the like can be used. Furthermore, regarding the component (e), one kind thereof may be used alone, or two or more kinds thereof may be used in combination.

Examples of the insulating inorganic filler include glass, silica, alumina, titanium oxide, carbon black, mica, and boron nitride. The insulating inorganic filler may be selected from silica, alumina, titanium oxide, and boron nitride and may be selected from silica, alumina, and boron nitride.

Examples of the whiskers include aluminum borate, aluminum titanate, zinc oxide, calcium silicate, magnesium sulfate, and boron nitride.

Examples of the resin filler include fillers formed from resins such as polyurethane and polyimide.

A resin filler has an excellent effect of enhancing the connection reliability because a resin filler has a smaller coefficient of thermal expansion compared to organic components (an epoxy resin, a curing agent, and the like). According to a resin filler, adjustment of the viscosity of the adhesive for semiconductors can be easily carried out. Resin fillers have an excellent function of relieving stress as compared to inorganic fillers.

Since an inorganic filler has a small coefficient of thermal expansion as compared to a resin filler, lowing of the coefficient of thermal expansion of an adhesive composition can be realized by an inorganic filler. Since inorganic fillers frequently have the particle size controlled in general-purpose products, it is also preferable for viscosity adjustment.

Since a resin filler and an inorganic filler respectively have advantageous effects, any one of them may be used according to the use application, or both may be used as a mixture in order to exhibit the functions of both of them.

The shape, particle size, and content of the component (e) are not particularly limited. The component (e) may be a product having the physical properties appropriately adjusted by a surface treatment.

The content of the component (e) may be 10% by mass or more or 15% by mass or more and may be 80% by mass or less or 60% by mass or less, based on the total amount of the solid content of the adhesive for semiconductors. The content of the component (e) may be 10% to 80% by mass or 15% to 60% by mass based on the total amount of the solid content of the adhesive for semiconductors.

It is preferable that the component (e) is composed of an insulation material. When the component (e) is composed of a conductive substance (for example, solder, gold, silver, or copper), there is a possibility that the insulation reliability (particularly, HAST resistance) may be deteriorated.

Other Components

The adhesive for semiconductors of the present embodiment may contain additives such as an oxidation inhibitor, a silane coupling agent, a titanium coupling agent, a leveling agent, and an ion trapping agent. These can be used singly or in combination of two or more kinds thereof. The blending amounts of these may be appropriately adjusted such that the effect of each of the additives is exhibited.

The adhesive for semiconductors of the present embodiment may be in a film form. In this case, workability in the case of sealing the gap between a semiconductor chip and a wiring board or the gap between a plurality of semiconductor chips by a Pre-applied method can be enhanced. An example of the method for producing the adhesive for semiconductors (film-shaped adhesive) of the present embodiment, which is molded into a film shape, will be described below.

First, a resin varnish is prepared by adding the component (a), the component (b), the component (c), and the component (d), and optionally added component (e) and the like into an organic solvent, and dissolving or dispersing the components by agitational mixing, kneading, or the like. Thereafter, the resin varnish is applied on a base material film that has been subjected to a release treatment, using a knife coater, a roll coater, an applicator, or the like, the organic solvent is removed by heating the coating film, and thereby a film-shaped adhesive can be formed on the base material film.

The thickness of the film-shaped adhesive is not particularly limited; however, for example, the height of the bumps before connection may be 0.5 to 1.5 times, 0.6 to 1.3 times, or 0.7 to 1.2 times.

When the thickness of the film-shaped adhesive is 0.5 or more times the height of the bumps, the generation of voids caused by non-filling of the adhesive can be sufficiently suppressed, and the connection reliability can be further enhanced. When the thickness is 1.5 or less times, since the amount of the adhesive extruded from the chip connection region at the time of connection can be sufficiently suppressed, adhesion of the adhesive to unnecessary parts can be sufficiently prevented. When the thickness of the film-shaped adhesive is larger than 1.5 times, the bumps must eliminate a large amount of the adhesive, and conduction failure is likely to occur. When a large amount of resin is eliminated against weakening of the bumps (microminiaturization of the bump diameter) caused by narrowing of the pitch and an increase in the number of pins, there is a possibility that the damage to the bumps may be increased.

Generally, since the height of the bumps is 5 to 100 μm, the thickness of the film-shaped adhesive may be 2.5 to 150 μm or 3.5 to 120 μm.

The organic solvent used for the preparation of the resin varnish may be an organic solvent having characteristics capable of uniformly dissolving or dispersing the various components. Examples of the organic solvent include dimethylformamide, dimethylacetamide, N-methyl-2-pyrrolidone, dimethyl sulfoxide, diethylene glycol dimethyl ether, toluene, benzene, xylene, methyl ethyl ketone, tetrahydrofuran, ethyl cellosolve, ethyl cellosolve acetate, butyl cellosolve, dioxane, cyclohexanone, and ethyl acetate. These organic solvents can be used singly or in combination of two or more kinds thereof. Agitational mixing and kneading at the time of preparing the resin varnish can be carried out using, for example, a stirrer, a Raikai mixer, a three-roll, a ball mill, a bead mill, or a HomoDisper.

The base material film is not particularly limited as long as it has heat resistance that can endure the heating conditions at the time of volatilizing the organic solvent, and examples thereof include a polyolefin film such as a polypropylene film or a polymethylpentene film; a polyester film such as a polyethylene terephthalate film or a polyethylene naphthalate film; a polyimide film; and a polyetherimide film. The base material film is not limited to a single-layer film formed from these films and may be a multilayer film formed from two or more kinds of materials.

The drying conditions at the time of volatilizing the organic solvent from the resin varnish applied on the base material film may be the conditions in which the organic solvent is sufficiently volatilized, and specifically, the conditions may be heating at 50° C. to 200° C. for 0.1 to 90 minutes. The organic solvent may be removed to a concentration of 1.5% by mass or less with respect to the total amount of the film-shaped adhesive.

The adhesive for semiconductors of the present embodiment may be directly formed on a wafer. Specifically, for example, a layer formed from the adhesive for semiconductors may be formed directly on a wafer by directly spin-coating the above-described resin varnish on the wafer to form a film and then removing the organic solvent.

The minimum melt viscosity of the adhesive for semiconductors of the present embodiment may be 400 to 2500 Pa·s, from the viewpoint that voids are more easily removed during curing under a pressurized atmosphere and superior reflow resistance is obtained. The minimum melt viscosity can be measured by the method described in the Examples. The temperature at which the adhesive for semiconductors exhibits the minimum melt viscosity (melting temperature) may be 100° C. to 200° C. or 120° C. to 170° C.

With regard to the adhesive for semiconductors of the present embodiment, from the viewpoint that temporary fixing of a semiconductor chip in a temperature range of 60° C. to 155° C. is facilitated, the melt viscosity at 80° C. may be 2000 to 10000 Pa·s, the melt viscosity at 130° C. may be 500 to 5000 Pa·s, or the melt viscosity at 80° C. may be 2000 to 10000 Pa·s while the melt viscosity at 130° C. may be 500 to 5000 Pa·s. The melt viscosity can be measured by the method described in the Examples.

The adhesive for semiconductors of the present embodiment described above can be suitably used for a process of curing by applying heat in a pressurized atmosphere, and particularly, the adhesive for semiconductors can be used for a process of mounting a plurality of semiconductor chips on a mounting-receiving member (a semiconductor chip, a semiconductor wafer, a wiring circuit board, or the like), with the adhesive for semiconductors interposed therebetween, temporarily fixing the semiconductor chips, and then performing curing and sealing all together under pressurized conditions. When the adhesive for semiconductors of the present embodiment is used for this process, the voids inside the adhesive are easily removed by pressurization, and superior reflow resistance is likely to be obtained.

Semiconductor Device

Figure 4:
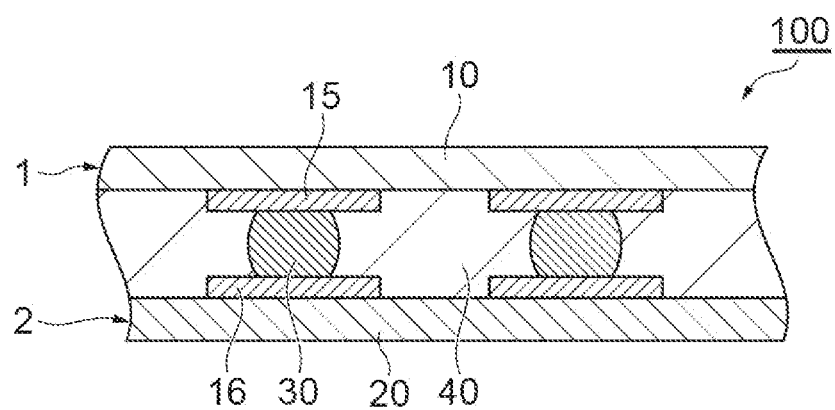
FIG. 4 is a schematic cross-sectional view illustrating an embodiment of a semiconductor device.
Figure 5:
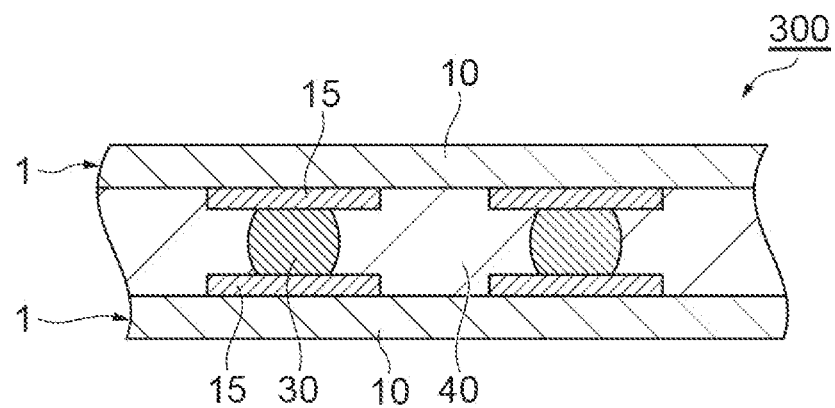
FIG. 5 is a schematic cross-sectional view illustrating an embodiment of the semiconductor device.
Figure 6:
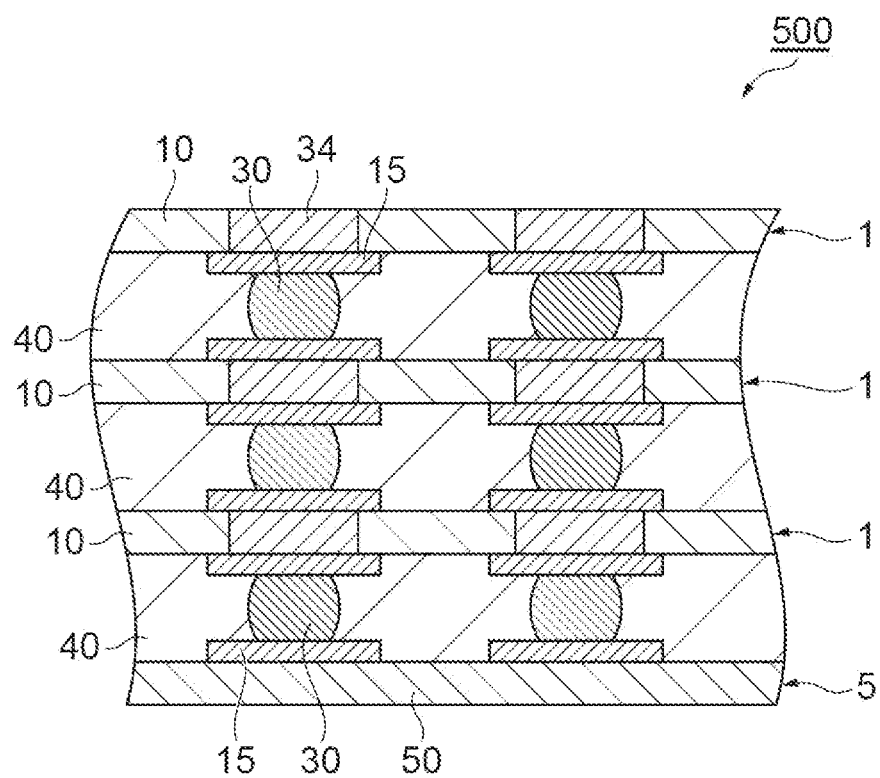
FIG. 6 is a schematic cross-sectional view illustrating an embodiment of the semiconductor device.

A semiconductor device of the present embodiment is a semiconductor device in which the respective connection parts of a semiconductor chip and a wiring circuit board are electrically connected to each other, or a semiconductor device in which the respective connection parts of a plurality of semiconductor chips are electrically connected to each other. In this semiconductor device, at least a part of the connection parts is sealed by a cured product of the adhesive for semiconductors. Hereinafter, the semiconductor device of the present embodiment will be described with reference to FIG. 4, FIG. 5, and FIG. 6. FIG. 4, FIG. 5, and FIG. 6 are each a cross-sectional view showing an embodiment of a semiconductor device that can be produced by a method according to the embodiment that will be described below. FIG. 4 is a schematic cross-sectional view illustrating a COB type connection mode in which a semiconductor chip and a substrate are connected. The semiconductor device 100 shown in FIG. 4 comprises a semiconductor chip 1, a substrate 2 (wiring circuit board), and an adhesive layer 40 interposed between these. In the case of the semiconductor device 100, the semiconductor chip 1 has a semiconductor chip main body 10, a wiring or bumps 15 disposed on the surface on the substrate 2 side of the semiconductor chip main body 10, and a solder 30 as a connection part disposed on the wiring or bumps 15. The substrate 2 has a substrate main body 20 and a wiring or bumps 16 as a connection part disposed on the surface of the semiconductor chip 1 side of the substrate main body 20. The solder 30 of the semiconductor chip 1 and the wiring or bumps 16 of the substrate 2 are electrically connected by metal bonding. The semiconductor chip 1 and the substrate 2 are flip-chip connected by the wiring or bumps 16 and the solder 30. The wiring or bumps 15 and 16 and the solder 30 are blocked from the external environment by being sealed by an adhesive layer 40. The adhesive layer 40 may be a cured product of the above-mentioned adhesive for semiconductors.

FIG. 5 shows a COC type connection mode in which semiconductor chips are connected. The configuration of the semiconductor device 300 shown in FIG. 5 is similar to that of the semiconductor device 100, except that two semiconductor chips 1 are flip-chip connected by means of a wiring or bumps 15 and solder 30.

In FIG. 5 and FIG. 6, the connection part such as the wiring or bumps 15 may be a metal film called a pad (for example, gold plating) or may be a post electrode (for example, a copper pillar).

The semiconductor chip main body 10 is not particularly limited and may be a chip formed by various semiconductors such as an elemental semiconductor composed of elements of the same kind, such as silicon or germanium, and a compound semiconductor such as gallium arsenide or indium phosphide.

The substrate 2 is not particularly limited as long as it is a wiring circuit board, and a circuit board having a wiring (wiring pattern) formed by etching and removing unnecessary sites of a metal layer formed on the surface of an insulating substrate containing glass epoxy, polyimide, polyester, ceramic, epoxy, bismaleimide triazine, or the like as a main component; a circuit board having a wiring (wiring pattern) formed by metal plating or the like on the surface of the above-described insulating substrate; a circuit board having a wiring (wiring pattern) formed by printing a conductive substance on the surface of the above-described insulating substrate; or the like can be used.

Gold, silver, copper, solder, tin, nickel, and the like are used as the main component of connection parts such as the wiring or bumps 15 and 16 and the solder 30. The main component of the solder 30 may be, for example, tin-silver, tin-lead, tin-bismuth, tin-copper, or tin-silver-copper. The connection part may be composed only of a single component or may be composed of a plurality of components. The connection part may have a structure in which these metals are laminated. Among metal materials, copper and solder are relatively inexpensive. From the viewpoint of enhancing the connection reliability and suppressing warpage, the connection part may contain solder.

Gold, silver, copper, solder, tin, nickel, and the like are used as the main component of the pad. The main component of the solder may be, for example, tin-silver, tin-lead, tin-bismuth, tin-copper, or tin-silver-copper. The pad may be composed only of a single component or may be composed of a plurality of components. The pad may have a structure in which these metals are laminated. From the viewpoint of connection reliability, the pad may contain gold or solder.

On the surface of the wiring or bumps 15 and 16 (wiring pattern), a metal layer containing gold, silver, copper, solder, tin, nickel, or the like as a main component may be formed. The main component of the solder may be, for example, tin-silver, tin-lead, tin-bismuth, or tin-copper. This metal layer may be composed only of a single component or may be composed of a plurality of components. The metal layer may have a structure in which a plurality of metal layers are laminated. The metal layer may contain relatively inexpensive copper or solder. From the viewpoint of enhancing the connection reliability and suppressing warpage, the metal layer may contain solder.

The semiconductor devices (or semiconductor packages) shown in FIG. 4 or FIG. 5 may be laminated and electrically connected with gold, silver, copper, solder, tin, nickel, or the like. The main component of the solder may be, for example, tin-silver, tin-lead, tin-bismuth, tin-copper, or tin-silver-copper. The metal for connection may be relatively inexpensive copper or solder. For example, as can be seen in the TSV technology, semiconductor chips may be flip-chip connected or laminated, with an adhesive layer interposed between the chips, holes penetrating through the semiconductor chips are formed, and the semiconductor chips may be connected to the electrode of a pattern surface.

FIG. 6 is a cross-sectional view illustrating another embodiment of the semiconductor device. The semiconductor device 500 shown in FIG. 6 is an embodiment of TSV of semiconductor chip lamination type. In the semiconductor device 500 shown in FIG. 6, a semiconductor chip 1 and an interposer 5 are flip-chip connected as the wiring or bumps 15 formed on the interposer main body 50 as a substrate are connected to the solder 30 of the semiconductor chip 1. An adhesive layer 40 is interposed between the semiconductor chip 1 and the interposer 5. On the surface on the opposite side of the interposer 5 in the semiconductor chip 1, semiconductor chips 1 are repeatedly laminated, with the wiring or bumps 15, the solder 30, and the adhesive layer 40 interposed therebetween. The wiring or bumps 15 of the pattern surfaces on the front and back of the semiconductor chip 1 are connected to each other by penetration electrodes 34 filled in the holes penetrating through the inside of the semiconductor chip main bodies 10. The material of the penetration electrode 34 may be copper, aluminum, or the like.

According to such TSV technology, a signal can be acquired from the back face of a semiconductor chip, which is usually not used. Furthermore, since penetration electrodes 34 vertically pass through the inside of the semiconductor chips 1, the distance between semiconductor chips 1 that face each other or between a semiconductor chip 1 and an interposer 5 is shortened, and flexible connection is enabled. In such TSV technology, the adhesive layer can be applied as a sealing material between semiconductor chips 1 that face each other and between a semiconductor chip 1 and an interposer 5.

Method for Producing Semiconductor Device

An embodiment of a method for producing a semiconductor device comprises a lamination step of laminating a first member having a connection part and a second member having a connection part, with an adhesive for semiconductors interposed therebetween such that the connection part of the first member and the connection part of the second member are disposed to face each other; and a sealing step of curing the adhesive for semiconductors by applying heat thereto and sealing at least a part of the connection parts with the cured adhesive for semiconductors. Here, the first member is, for example, a wiring circuit board, a semiconductor chip, or a semiconductor wafer, and the second member is a semiconductor chip. The sealing step includes heating a laminated body (hereinafter, may be referred to as "temporarily fixed body") obtained in the lamination step to a temperature higher than or equal to the melting point of the connection parts disposed to face each other and thereby bonding the connection parts that are disposed to face each other such that the connection parts are electrically connected; and curing the adhesive for semiconductors by applying heat.

When the first member is a semiconductor chip, the lamination step includes, for example, a step of disposing a plurality of semiconductor chips on a stage; and a temporary fixing step of sequentially disposing another semiconductor chip on each of the semiconductor chips disposed on the stage, with an adhesive for semiconductors interposed therebetween, and obtaining a plurality of temporarily fixed bodies, which are laminated bodies each having a semiconductor chip, an adhesive for semiconductors, and another semiconductor chip laminated in this order.

When the first member is a wiring circuit board or a semiconductor wafer, where a plurality of semiconductor chips are mounted, the lamination step includes, for example, a step of disposing a wiring circuit board or a semiconductor wafer on a stage; and a temporary fixing step of sequentially disposing a plurality of semiconductor chips on the wiring circuit board or semiconductor wafer disposed on the stage, with an adhesive for semiconductors interposed therebetween, while heating the stage, and obtaining a temporarily fixed body having a wiring circuit board, an adhesive for semiconductors, and the plurality of the semiconductor chips, or a temporarily fixed body having a semiconductor wafer, an adhesive for semiconductors, and the plurality of the semiconductor chips.

In the temporary fixing step, for example, first, an adhesive for semiconductors is disposed on the first member or on the second member. It is also acceptable to stick a film-shaped adhesive for semiconductors to the first member or the second member. Next, a semiconductor chip that has been singularized on a dicing tape are picked up and then suctioned to a pressure-bonding tool (pressure-bonding head) of a pressure-bonding machine, and the semiconductor chip is temporarily fixed on a wiring circuit board, another semiconductor chip, or a semiconductor wafer.

The method of disposing the adhesive for semiconductors is not particularly limited, and for example, when the adhesive for semiconductors is in a film form, methods such as hot pressing, roll lamination, and vacuum lamination may be used. The area and thickness of the adhesive for semiconductors to be disposed are appropriately set according to the sizes of the first member and the second member, the height of the connection part (bumps), and the like. The adhesive for semiconductor may be disposed on a semiconductor chip. A semiconductor wafer having the adhesive for semiconductors disposed thereon may be singularized by dicing the semiconductor wafer.

In the temporary fixing step, alignment is required in order to electrically connect the connection parts. For that reason, a pressure-bonding machine such as a flip-chip bonder is generally used.

When the pressure-bonding tool picks up the semiconductor chip for temporary fixing, the pressure-bonding tool may be at a low temperature so that heat is not transferred to the semiconductor adhesive on the semiconductor chip. During pressure-bonding (temporary pressure-bonding), the semiconductor chip may be heated to a high temperature to some extent so as to increase fluidity of the adhesive for semiconductors and to efficiently eliminate entrained voids. The semiconductor chip may be heated to a temperature lower than the initiation temperature for the curing reaction of the adhesive for semiconductors. In order to shorten the cooling time, the difference between the temperature of the pressure-bonding tool at the time of picking up the semiconductor chip and the temperature of the pressure-bonding tool at the time of temporary fixing may be small. This temperature difference may be 100° C. or lower, 60° C. or lower, or substantially 0° C. When the temperature difference is 100° C. or higher, productivity tends to be lowered because cooling of the pressure-bonding tool takes time. The initiation temperature for the curing reaction of the adhesive for semiconductors refers to the onset temperature of an exothermic peak of the curing reaction at the time of making measurement using DSC (manufactured by PerkinElmer, Inc., DSC-Pyirs1) under the conditions of a sample amount of 10 mg, a rate of temperature increase of 10° C./min., and an air or nitrogen atmosphere.

The load applied for temporary fixing is appropriately set in consideration of the number of connection parts (bumps), absorption of the height variation of the connection parts (bumps), and control of the deformation volume of the connection parts (bumps) and the like. In the temporary fixing step, the connection parts that face each other may be in contact after pressure-bonding (temporary pressure-bonding). When the connection parts are in contact after pressure-bonding, metallic bonds of the connection parts are easily formed during the pressure-bonding in the sealing step (main pressure-bonding), and jamming of the adhesive for semiconductors tends to occur less. The load may be large for the purpose of eliminating voids and bringing contact of the connection parts, and for example, the load may be 0.009 N to 0.2 N per one connection part (for example, bump).

The pressure-bonding time of the temporary fixing step may be, for example, 5 seconds or less, 3 seconds or less, or 2 seconds or less, from the viewpoint of enhancing productivity.

The heating temperature of the stage is a temperature lower than the melting point of the connection part of the first member and the melting point of the connection part of the second member and is usually 60° C. to 150° C. By heating at such a temperature, the voids entrained into the adhesive for semiconductors can be efficiently eliminated.

When the lamination step includes the above-described temporary fixing step, in the sealing step subsequent to the temporary fixing step, the adhesive for semiconductors in a plurality of laminated bodies or a laminated body comprising a plurality of semiconductor chips may be cured all together to seal a plurality of connection parts all together. According to the sealing step, the connection parts that face each other are bonded by metallic bonds, and at the same time, the gaps between the connection parts are usually filled by the adhesive for semiconductors.

In the sealing step, the connection parts may be bonded by heating the temporarily fixed body at a temperature higher than or equal to the melting point of the metal of at least one between the connection parts that face each other (for example, bump-bump, bump-pad, or bump-wiring). For example, when the metal of the connection parts is solder, the heating temperature may be 220° C. or higher and 330° C. or lower. When the heating temperature is a low temperature, the metal of the connection parts does not melt, and there is a possibility that sufficient metallic bonds may not be formed. When the heating temperature is an excessively high temperature, there is a tendency that the effect of suppressing voids may be relatively reduced, or solder may be easily scattered. For the bonding of the connection parts, the temporarily fixed body may be heated while being pressurized, using a pressure-bonding machine. The adhesive for semiconductors may be cured by the heating for bonding of the connection parts. The curing reaction of the adhesive for semiconductors is caused to partially proceed during the heating for bonding of the connection parts, and subsequently the adhesive for semiconductors may be further cured by applying heat in a pressurized atmosphere. Examples of the apparatus for heating in pressurized atmosphere include a pressure reflow furnace and a pressure oven.

When pressurization for the bonding of the connection parts is carried out using a pressure-bonding machine, since it is difficult for the heat of the pressure-bonding machine to be transferred to the adhesive for semiconductors (fillet) protruding at the side surfaces of the connection parts, in many cases, a further heating treatment for causing the curing of the adhesive for semiconductors to sufficiently proceed is required after the pressure-bonding for the bonding of the connection parts. For that reason, the pressurization in the sealing step may be carried out not by a pressure-bonding machine but by the air pressure inside a pressure reflow furnace, a pressure oven, or the like. The connection parts may be bonded by applying heat in a pressurized atmosphere, and at the same time, the adhesive for semiconductors may be cured. When pressure is applied by air pressure, heat can be applied to the entirety, the heating treatment after pressure-bonding can be shortened or eliminated, and productivity is enhanced. When pressure is applied by air pressure, it is easy to carry out the main pressure-bonding of a plurality of laminated bodies (temporarily fixed bodies) or a laminated comprising a plurality of temporarily fixed semiconductor chips (temporarily fixed body) all together. Pressurization by air pressure is more advantageous than direct pressurization using a pressure-bonding machine, even from the viewpoint of suppressing fillet. Suppression of fillet is important for the tendency of size reduction and density increase of semiconductor devices.

The pressurizing atmosphere for pressure-bonding in the sealing step is not particularly limited; however, the pressurizing atmosphere may be an atmosphere containing air, nitrogen, formic acid, or the like.

The pressure of pressure-bonding in the sealing step is appropriately set according to the size and number of the members to be connected, and the like. The pressure may be, for example, higher than the atmospheric pressure and 1 MPa or less. The pressure may be large from the viewpoint of suppressing voids and enhancing connectivity. From the viewpoint of suppressing fillet, the pressure may be small. For that reason, the pressure may be 0.05 to 0.5 MPa.

The pressure-bonding time for the main pressure-bonding varies depending on the constituent metal of the connection parts; however, from the viewpoint of enhancing productivity, a shorter time is more preferable. When the connection parts are solder bumps, the connection time may be 20 seconds or less, 10 seconds or less, or 5 seconds or less. In the case of metal connection of copper-copper or copper-gold, the connection time may be 60 seconds or less.

As in the case of a semiconductor device having a TSV structure, when a plurality of semiconductor chips are three-dimensionally laminated, a semiconductor device may be obtained by stacking the plurality of semiconductor chips one by one to be in a temporarily fixed state, and subsequently heating and pressurizing the laminated semiconductor chips all together.

Figure 7:
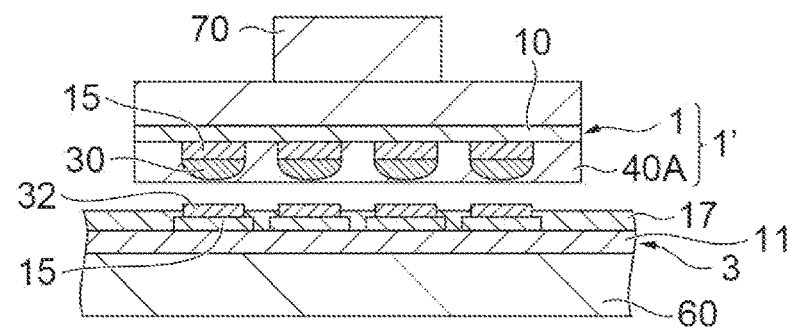
FIG. 7 is a schematic cross-sectional view illustrating an embodiment of a method for producing a semiconductor device.
Figure 7:
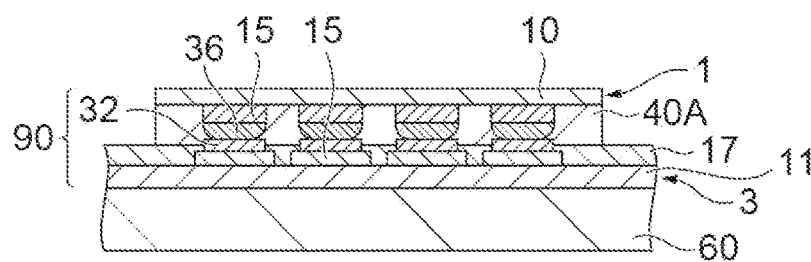
Figure 7:
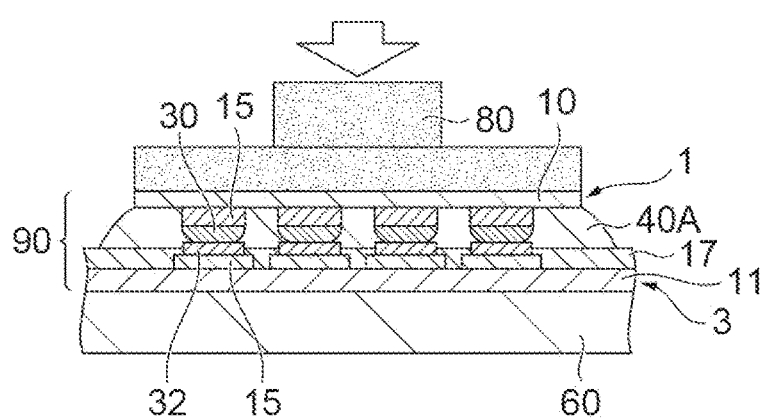
Figure 7:
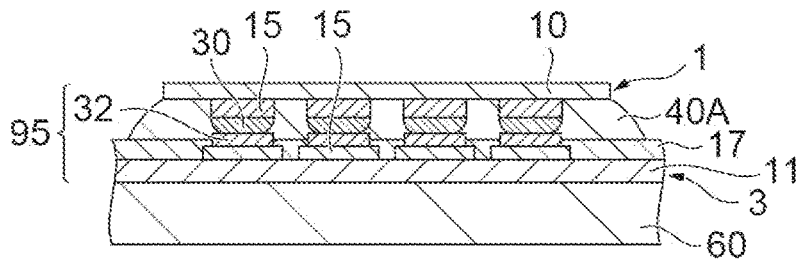
Figure 7:
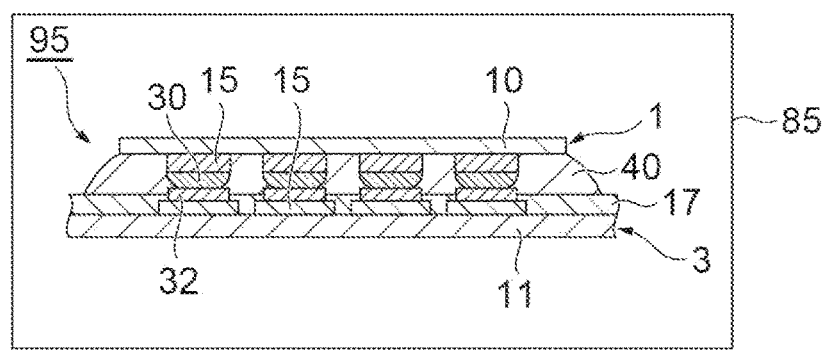

FIG. 7 is a schematic cross-sectional view illustrating an embodiment of the method for producing a semiconductor device. In the case of the method shown in FIG. 7, a bonded body 95 in which a connection part (solder 30) of a semiconductor chip 1 and a connection part (solder 32) of a semiconductor wafer 3 are electrically connected to each other, and the connection parts electrically connected to each other (solders 30 and 32) are sealed by an adhesive layer 40 formed from a cured adhesive for semiconductors, is formed by interposing an adhesive layer 40A formed from an adhesive for semiconductors between a semiconductor chip 1 having a plurality of solder pieces 32 as a connection part and a semiconductor wafer 3 having the plurality of solder pieces 32 as a connection part, and heating the semiconductor chip 1, the semiconductor wafer 3, and the adhesive layer 40A. More particularly, the step of forming the bonded body 95 includes disposing a semiconductor wafer 3 on a stage 60 as shown in FIG. 7(a); forming a temporarily fixed body 90, which is a laminated body composed of the semiconductor wafer 3, an adhesive layer 40A, and a semiconductor chip 1, as shown in FIG. 7(b); pressurizing while heating the temporarily fixed body 90 to a temperature at which at least one of the solders 30 and 32 as the connection parts melts as shown in FIG. 7(c), to form a bonded body 95 in which the solders 30 and 32 as the connection parts are electrically connected as shown in FIG. 7(d); and heating the bonded body 95 in a pressurized atmosphere inside a pressure oven 85 as shown in FIG. 7(e) to form a cured adhesive layer 40 that seals the connection parts (solders 30 and 32).

The semiconductor chip 1 has a semiconductor chip main body 10, a wiring or bumps 15 provided on the semiconductor chip main body 10, and solder 30 as a connection part provided on the wiring or bumps 15. The semiconductor wafer 3 has a wafer main body 11, a wiring or bumps 15 provided on the wafer main body 11, solder 32 as a connection part provided on the wiring or bumps 15, and a passivation film 17 provided on the wafer main body 11 and covering the wiring or bumps 15.

The temporarily fixed body 90 is formed by thermocompression-bonding an adhesive-attached semiconductor chip 1' to the semiconductor wafer 3 on a heated stage 60 by means of a pressure-bonding tool 70. The heating temperature of the stage 60 is a temperature lower than the melting point of the solder 30 and the melting point of the solder 32, and for example, the heating temperature may be 60° C. to 150° C. or 70° C. to 100° C. The temperature of the pressure-bonding tool 70 may be, for example, 80° C. to 350° C. or 100° C. to 170° C. The time for thermocompression bonding for forming the temporarily fixed body 90 may be, for example, 5 seconds or less, 3 seconds or less, or 2 seconds or less.

The bonded body 95 is formed by pressurizing while heating the temporarily fixed body 90 on the heated stage 60 to a temperature higher than or equal to at least one of the melting point of the solder 30 and the melting point of the solder 32, using a pressure-bonding tool 80. The temperature of the pressure-bonding tool 80 may be, for example, 180° C. to higher, 220° C. or higher, or 250° C. or higher, and may be 350° C. or lower, 320° C. or lower, or 300° C. or lower. The heating temperature of the stage 60 during the thermocompression bonding for forming the bonded body 95 may be 60° C. to 150° C. or 70° C. to 100° C. The time for thermocompression bonding by the pressure-bonding tool 80 for forming the bonded body 95 may be, for example, 5 seconds or less, 3 seconds or less, or 2 seconds or less.

Curing of the adhesive layer 40A is caused to sufficiently proceed by heating and pressurizing inside the pressure oven 85. However, curing of the adhesive layer 40A may partially proceed during the course of heating and pressurizing for forming the bonded body 95. The heating temperature by the pressure oven 85 is lower than the melting points of the solders 30 and 32, and the heating temperature may be a temperature at which curing of the adhesive layer 40A proceeds and may be, for example, 170° C. to 200° C.

The bonded body 95 having a plurality of semiconductor chips 1 may be formed by sequentially mounting the plurality of semiconductor chips 1 on one sheet of semiconductor wafer 3, with the adhesive layer 40 interposed therebetween, and then the bonded body 95 may be heated and pressurized inside the pressure oven 85. In that case, the adhesive layer 40A between the semiconductor chip 1 and the semiconductor wafer 3 initially disposed on the semiconductor wafer 3 is continuously subjected to thermal history due to the stage 60 until mounting of all the semiconductor chips 1 is completed. Even after being subjected to thermal history for a long time period, the adhesive layer 40A containing the adhesive for semiconductors according to the above-mentioned embodiments can give a bonded body 95 with high reliability.

EXAMPLES

Hereinafter, the present invention will be described more specifically by way of Examples. However, the present invention is not intended to be limited to the Examples.

The compounds used in each Examples and Comparative Examples are as follows.

Component (a): Thermoplastic Resin
  Polyurethane (manufactured by DIC Covestro Polymer, Ltd., trade name "T-8175N", Tg: −23° C., Mw: 120000)
  Phenoxy resin (manufactured by Nippon Steel & Sumikin Chemical Co., Ltd., trade name "ZX1356-2", Tg: about 71° C., Mw: about 63000)
  Phenoxy resin (manufactured by Nippon Steel & Sumikin Chemical Co., Ltd., trade name "FX293", Tg: about 160° C., Mw: about 40000)

Component (b): Thermosetting Resin
  Polyfunctional solid epoxy resin containing triphenolmethane skeleton (manufactured by Mitsubishi Chemical Corporation, trade name: "EP1032H60")
  Bisphenol F type liquid epoxy resin (manufactured by Mitsubishi Chemical Corporation, trade name "YL983U")

Component (c): Curing Agent
  2,4-Diamino-6-[2'-methylimidazolyl-(1')]-ethyl-s-triazine isocyanuric acid adduct (manufactured by Shikoku Chemicals Corporation, trade name "2MAOK-PW", Mw: 384)
  2-Phenyl-4,5-dihydroxymethylimidazole ((manufactured by Shikoku Chemicals Corporation, trade name "2PHZ-PW", Mw: 204)

Component (d): Flux Compound
  Diphenolic acid (manufactured by Tokyo Chemical Industry Co., Ltd., melting point: 177° C., molecular weight: 286)
  Benzilic acid (manufactured by Fujifilm Wako Pure Chemical Corporation, melting point: 152° C., molecular weight: 228)
  Diphenylacetic acid (manufactured by Fujifilm Wako Pure Chemical Corporation, melting point: 149° C., molecular weight: 212)
  Glutaric acid (manufactured by Fujifilm Wako Pure Chemical Corporation, melting point: 98° C., molecular weight: 132)

(e) Filler
  Silica filler (manufactured by Admatechs Co., Ltd., trade name "SE2030", average particle size 0.5 μm)
  Epoxysilane surface-treated silica filler (manufactured by Admatechs Co., Ltd., trade name "SE2030-SEJ", average particle size 0.5 μm)
  Methacryl surface-treated silica filler (manufactured by Admatechs Co., Ltd., trade name "YA050C-SM1", average particle size about 0.05 μm)
  Methacryl surface-treated silica filler (manufactured by Admatechs Co., Ltd., trade name "180 nm SM-EH1", average particle size about 0.18 μm)

The weight average molecular weight (Mw) of the component (a) was determined by a GPC method. The details of the GPC method are as follows.
  Apparatus name: HPLC-8020 (product name, manufactured by Tosoh Corporation)
  Column: 2 pieces of GMHXL+1 piece of G-2000XL
  Detector: RI detector
  Column temperature: 35° C.
  Flow rate: 1 mL/min.
  Standard substance: Polystyrene Production of Film-Shaped Adhesive or Semiconductors A thermoplastic resin, a thermosetting resin, a curing agent, a flux compound, and a filler in the blending amounts (unit: parts by mass) shown in Table 1 were added to an organic solvent (cyclohexanone) such that the NV value ([adhesive mass after drying]/[coating varnish mass before drying]×100) would be 50%. Into the same container as that containing a mixture of these, Φ1.0-mm beads and Φ2.0-mm zirconia beads of the same mass as the blending amount of the solid content (thermoplastic resin, thermosetting resin, curing agent, flux compound, and filler) were added, and the mixture was stirred for 30 minutes in a ball mill (Fritsch Japan Co., Ltd., planetary pulverizing mill P-7). After the stirring, zirconia beads were removed by filtration, and a coating varnish was produced.

The obtained coating varnish was applied on a base material film (manufactured by Toyobo Film Solutions, Ltd., trade name "PUREX A55") with a small-sized precision coating apparatus (Yasui Seiki, Inc.). The coating film was dried for 10 minutes at 100° C. using a clean oven (manufactured by ESPEC Corporation) to obtain a film-shaped adhesive having a film thickness of 20 μm.

DSC Measurement 10 mg of the obtained film-shaped adhesive was weighed in an aluminum pan (manufactured by Epolead Services, Inc.), the aluminum pan was covered with an aluminum lid, and the evaluation sample was sealed in the sample pan using a crimper. DSC was measured using a differential scanning calorimeter (Thermo plus DSC8235E, manufactured by Rigaku Corporation) in a nitrogen atmosphere at a rate of temperature increase of 10° C./min. in a measurement temperature range of 30° C. to 300° C. As the means for analyzing the calorific value, a method of analyzing a partial area was used. The total calorific value (unit: J/g) was calculated by performing specification of the baseline of the analysis temperature range and integration of the peak area by instructing the analysis of each DSC curve in a temperature range of 60° C. to 280° C. Subsequently, 155° C. was designated as the division temperature, thereby the respective partial areas at 60° to 155° C. and 155° C. to 280° C. were integrated, and the respective calorific values (unit: J/g) were calculated. On the other hand, as the means for analyzing the onset temperature, a method of analyzing the total area (JIS method) was used, the intersection of the baseline of a peak and the maximum slope point in each DSC curve was calculated by instructing the analysis in a temperature range of 60° C. to 280° C., and the onset temperature (unit: ° C.) was determined.

TABLE 1

|  |  | Example | | | | | | | Comp. Example | |
|---|---|---|---|---|---|---|---|---|---|---|
|  |  | 1 | 2 | 3 | 4 | 5 | 6 | 7 | 1 | 2 |
| Comp. (a) | T8175N | 12.6 | 14.9 | 16.1 | 16.9 | — | — | — | — | — |
|  | ZX-1356-2 | — | — | — | — | — | — | 17.5 | 17.0 | — |
|  | FX293 | — | — | — | — | 12.3 | 12.4 | — | — | 12.2 |
| Comp. (b) | EP1032H60 | 37.7 | 44.8 | 48.4 | 50.8 | 27.8 | 27.9 | 26.2 | 25.6 | 27.4 |
|  | YL983U | — | — | — | — | 12.3 | 12.4 | 11.7 | 11.4 | 12.2 |
| Comp. (c) | 2MAOK | — | — | — | — | — | 1.9 | 1.8 | 1.1 | 2.4 |
|  | 2PHZ | 1.3 | 1.5 | 1.6 | 1.7 | 1.8 | — | — | — | — |
| Comp. (d) | Diphenolic acid | 1.3 | — | — | — | — | — | — | — | — |
|  | Benzilic acid | — | 1.5 | 1.6 | 1.7 | — | — | — | — | — |
|  | Diphenylacetic acid | — | — | — | — | 1.8 | — | — | — | — |
|  | Glutaric acid | — | — | — | — | — | 1.2 | 1.2 | 2.3 | 2.4 |
| Comp. (e) | SE2030 | 9.4 | 7.5 | 6.5 | 5.8 | 8.8 | — | — | 8.5 | 8.7 |
|  | SE2030-SEJ | 9.4 | 7.5 | 6.5 | 5.8 | 8.8 | — | — | 8.5 | 8.7 |
|  | 18 nm SM-EH1 | — | — | — | — | — | 44.2 | 41.6 | — | — |
|  | YA050C-SM1 | 28.3 | 22.3 | 19.3 | 17.3 | 26.4 | — | — | 25.6 | 26.0 |
| Molar ratio r |  | 0.71 | 0.89 | 0.89 | 0.89 | 0.96 | 1.84 | 1.94 | 6.08 | 2.91 |
| Calorific value @60-155° C. (J/g) |  | −3 | −7 | −11 | −6 | 2 | 13 | 6 | 22 | 21 |
| Calorific value @155-280° C. (J/g) |  | 93 | 114 | 115 | 132 | 128 | 152 | 113 | 125 | 152 |
| Calorific value @60-280° C. (J/g) |  | 90 | 107 | 104 | 126 | 130 | 165 | 119 | 147 | 173 |
| Onset temperature (° C.) |  | 172 | 184 | 183 | 184 | 166 | 158 | 158 | 144 | 154 |

\* In the table, the molar ratio r represents the ratio of the molar number of the acid group in the entire flux compound to the molar number of the reactive group in the entire curing agent.

In the following description, evaluation methods for the film-shaped adhesives obtained in Examples and Comparative Examples will be described. The evaluation results are shown in Table 2.

Evaluation of Film-Forming Properties

A 20-μm film-shaped adhesive obtained in each of the Examples and Comparative Examples was punched by pounding with a hammer from above using a punching punch (φ20 mm), and a case where the punched sample did not crack was rated as "A", while a case where cracking and/or chipping did not occur was rated as "B".

Evaluation of High-Temperature Shelf Stability

An analysis of a DSC curve obtained as described above was performed, and the calorific value (unit: J/g) at 60° C. to 280° C. was calculated. This was designated as initial calorific value.

A film-shaped adhesive (initial sample) obtained in each of the Examples and Comparative Examples was inserted into an oven set at 100° C. and was heat-treated for one hour. The sample after the heating treatment was taken out, and an evaluation sample A after a 100° C. heat treatment was obtained.

A film-shaped adhesive (initial sample) obtained in each of the Examples and Comparative Examples was inserted into an oven set at 80° C. and was heat-treated for 12 hours. The sample after the heating treatment was taken out, and an evaluation sample B after an 80° C. heat treatment was obtained.

The calorific value (unit: J/g) at 60° C. to 280° C. was calculated by the same procedure as that before heating, using the evaluation sample A and the evaluation sample B. This was designated as post-treatment calorific value.

The reaction rate was calculated by the following formula, using the two calorific values thus obtained (the calorific value of the initial sample and the calorific value of the evaluation sample A, or the calorific value of the initial sample and the calorific value of the evaluation sample B).

Reaction rate (%)=(Initial calorific value−post-heat treatment calorific value)/initial calorific value× 100

A case where the reaction rate was less than 10% was rated as "A"; a case where the reaction rate was 10% or more and less than 20% was rated as "B"; and a case where the reaction rate was 20% or more was rated as "C".

Viscosity Measurement

By using the initial sample and the evaluation sample A of each of the Examples and Comparative Examples, the melt viscosity at 80° C. (80° C. viscosity), the melt viscosity at 130° C. (130° C. viscosity), the minimum melt viscosity, and the temperature exhibiting the minimum melt viscosity (melting temperature) were measured using a rotary rheometer (manufactured by TA Instruments, Inc., trade name: ARES-G2).

[Measurement Conditions]

Rate of temperature increase: 10° C./min.
Frequency: 10 Hz
Temperature range: 30° C. to 170° C.

Evaluation of Voids

Production of Semiconductor Device

An evaluation sample A produced as described above was cut out into a size of 7.5 mm on all four sides, and this was stuck onto a semiconductor chip with a plurality of solder bumps (chip size: 7.3 mm×7.3 mm, thickness 0.1 mm, bump (connection part) height: about 45 μm (sum of copper pillar and solder), number of bumps: 1048 pins, pitch 80 μm, product name: WALTS-TEG CC80, manufactured by Walts Co., Ltd.) at 80° C. The film-shaped adhesive-attached semiconductor chip was sequentially pressure-bonded to another semiconductor chip (chip size: 10 mm×10 mm, thickness 0.1 mm, number of bumps: 1048 pins, pitch 80 μm, product name: WALTS-TEG IP80, manufactured by Walts Co., Ltd.) by heating and pressurizing the assembly, and the semiconductor chips were temporarily fixed. The conditions for pressure-bonding were 130° C., 75 N, and 2 seconds.

The laminated body after temporary fixing (temporarily fixed body) was heat-treated for 3 hours in an oven at 100° C., and then the laminated body was taken out for the moment and was heated and pressurized at 200° C. and 0.6 MPa for one hour in a pressure oven to obtain a sample for void evaluation.

Analysis and Evaluation

An image of the external appearance of the sample was captured using an ultrasonic diagnostic imaging apparatus (Insight-300, manufactured by Insight, Inc.). From the obtained image, an image of the adhesive layer between the chips was taken with a scanner (GT-9300UF, manufactured by Seiko Epson Corp.). In the obtained image, void parts were identified by color tone correction and black and white conversion using image processing software (Adobe Photoshop (trade name)), and the proportion occupied by the void parts was calculated by a histogram. The area of the entire adhesive layer containing the void parts was taken as 100% by area. A case where the area proportion of the voids was less than 10% was rated as "A"; a case where the area proportion of the voids was 10% or more and less than 30% was rated as "B"; and a case where the area proportion was 30% or more was rated as "C". The evaluation results are shown in Table 2.

body (temporarily fixed body), 95: bonded body, 100, 300, 500: semiconductor device.

The invention claimed is:

1. An adhesive for semiconductors, the adhesive comprising:
   a thermoplastic resin;
   a thermosetting resin;
   a curing agent having a reactive group; and
   a flux compound having a carboxyl group,
   wherein the adhesive has a calorific value of 20 J/g or less at 60° C. to 155° C. on a DSC curve when the DSC curve is obtained by differential scanning calorimetry involving heating the adhesive at a rate of temperature increase of 10° C./min.

2. The adhesive for semiconductors according to claim 1, wherein the thermoplastic resin has a weight average molecular weight of 10000 or more.

3. The adhesive for semiconductors according to claim 1, wherein a content of the thermoplastic resin is 1% to 30% by mass based on a total amount of solid contents of the adhesive.

4. The adhesive for semiconductors according to claim 1, wherein the curing agent comprises an amine-based curing agent.

TABLE 2

|  | Example | | | | | | | Comparative Example | |
|---|---|---|---|---|---|---|---|---|---|
|  | 1 | 2 | 3 | 4 | 5 | 6 | 7 | 1 | 2 |
| Initial 80° C. viscosity (Pa·s) | 9200 | 6900 | 4900 | 4000 | 2600 | 5000 | 3600 | 5800 | 7500 |
| Initial 130° C. viscosity (Pa·s) | 3600 | 2100 | 1500 | 1000 | 600 | 1900 | 1400 | 2300 | 3900 |
| Initial minimum melt viscosity (Pa·s) | 1900 | 1400 | 900 | 400 | 400 | 1700 | 1200 | 2200 | 3800 |
| Initial melting temperature (° C.) | 157 | 160 | 158 | 158 | 153 | 138 | 144 | 137 | 133 |
| 100° C./1 h 80° C. viscosity (Pa·s) | 7100 | 6500 | 5400 | 4900 | 3800 | 8200 | 7000 | 18400 | 21000 |
| 100° C./1 h 130° C. viscosity (Pa·s) | 1900 | 1800 | 1200 | 700 | 1100 | 2400 | 1800 | 5500 | 6500 |
| 100° C./1 h minimum melt viscosity (Pa·s) | 1200 | 1100 | 700 | 300 | 900 | 2100 | 1800 | 5300 | 6300 |
| 100° C./1 h melting temperature (° C.) | 158 | 160 | 158 | 158 | 151 | 132 | 132 | 133 | 128 |
| Initial calorific value (J/g) | 90 | 107 | 104 | 126 | 130 | 165 | 119 | 147 | 173 |
| 80° C./12 h calorific value (J/g) | 89 | 107 | 104 | 126 | 129 | 162 | 119 | 80 | 130 |
| 80° C./12 h reaction rate (%) | 1 | 0 | 0 | 0 | 1 | 2 | 0 | 46 | 25 |
| 80° C./12 h high temperature shelf stability evaluation | A | A | A | A | A | A | A | C | C |
| 100° C./1 h calorific value (J/g) | 86 | 107 | 104 | 124 | 128 | 148 | 102 | 109 | 134 |
| 100° C./1 h reaction rate (%) | 4 | 0 | 0 | 2 | 2 | 10 | 14 | 26 | 23 |
| 100° C./1 h high temperature shelf stability evaluation | A | A | A | A | A | B | B | C | C |
| Void evaluation | A | A | A | A | A | B | B | C | C |

REFERENCE SIGNS LIST

1: semiconductor chip, 2: substrate, 3: semiconductor wafer, 10: semiconductor chip main body, 11: wafer main body, 15, 16: wiring or bump, 20: substrate main body, 30, 32: solder, 34: penetration electrode, 40: adhesive layer, 50: interposer main body, 90: laminated 5. The adhesive for semiconductors according to claim 1, wherein the curing agent comprises an imidazole-based curing agent.

6. The adhesive for semiconductors according to claim 1, wherein a content of the curing agent is 2.3% by mass or less based on a total amount of solid contents of the adhesive.

7. The adhesive for semiconductors according to claim 1, wherein the flux compound has a melting point of 25° C. to 230° C.

8. The adhesive for semiconductors according to claim 1, wherein the thermosetting resin comprises an epoxy resin.

9. The adhesive for semiconductors according to claim 1, wherein the thermosetting resin substantially does not comprise a liquid state epoxy resin at 35° C.

10. The adhesive for semiconductors according to claim 1, wherein the adhesive is in a film form.

11. The adhesive for semiconductors according to claim 1, wherein the adhesive has a minimum melt viscosity of 400 to 2500 Pa·s.

12. A method for producing a semiconductor device, the semiconductor device comprising a plurality of semiconductor chips and a wiring circuit board with respective connection parts thereof being electrically connected to each other, the method comprising:
  a step of disposing the wiring circuit board having a connection part on a stage;
  a temporary fixing step of sequentially disposing the plurality of semiconductor chips, each having a connection part, on the wiring circuit board disposed on the stage, with the adhesive for semiconductors according to claim 1 interposed therebetween, while heating the stage at a temperature of from 60° C. to 155° C., and obtaining a laminated body having the adhesive for semiconductors laminated between the wiring circuit board and the plurality of the semiconductor chips; and
  a sealing step of bonding the respective connection parts to electrically connect to each other and curing the adhesive for semiconductors by applying heat, to seal at least one of the connection parts with the cured adhesive.

13. A method for producing a semiconductor device, the semiconductor device comprising a plurality of semiconductor chips with respective connection parts thereof being electrically connected to each other, the method comprising:
  a step of disposing the plurality of semiconductor chips on a stage;
  a temporary fixing step of sequentially disposing another semiconductor chip on each of the semiconductor chips disposed on the stage, with the adhesive for semiconductors according to claim 1 interposed therebetween, while heating the stage at a temperature of from 60° C. to 155° C., and obtaining a plurality of laminated bodies each having the adhesive for semiconductors laminated between one of the semiconductor chips and the other semiconductor chip; and
  a sealing step of bonding the respective connection parts to electrically connect to each other and curing the adhesive for semiconductors by applying heat, to seal at least one of the connection parts with the cured adhesive.

14. A method for producing a semiconductor device, the semiconductor device comprising a plurality of semiconductor chips and a semiconductor wafer with respective connection parts thereof being electrically connected to each other, the method comprising:
  a step of disposing the semiconductor wafer having a connection part on a stage;
  a temporary fixing step of sequentially disposing the plurality of semiconductor chips, each having a connection part, on the semiconductor wafer disposed on the stage, with the adhesive for semiconductors according to claim 1 interposed therebetween, while heating the stage at a temperature of from 60° C. to 155° C., and obtaining a laminated body having the adhesive for semiconductors laminated between the semiconductor wafer and the plurality of the semiconductor chips; and
  a sealing step of bonding the respective connection parts to electrically connect to each other and curing the adhesive for semiconductors by applying heat, to seal at least one of the connection parts with the cured adhesive.

15. A semiconductor device comprising:
a semiconductor chip having a first connection part; and
a wiring circuit board having a second connection part,
the first connection part of the semiconductor chip and the second connection part of the wiring circuit board being electrically connected to each other,
wherein at least one of the first and second connection parts is sealed by a cured product of the adhesive for semiconductors according to claim 1.

16. A semiconductor device comprising:
a plurality of semiconductor chips including a first semiconductor chip having a first connection part, and a second semiconductor chip having a second connection part, wherein the first connection part is electrically connected to the second connection part; and
a cured product of the adhesive for semiconductors according to claim 1 which seals at least one of the first and second connection parts.

17. The adhesive for semiconductors according to claim 1, wherein the adhesive has an onset temperature of 158° C. or higher as determined by the differential scanning calorimetry.

* * * * *